(12) United States Patent
Nagata et al.

(10) Patent No.: US 7,683,977 B2
(45) Date of Patent: Mar. 23, 2010

(54) DISPLAY DEVICE AND METHOD OF MANUFACTURING THE DISPLAY DEVICE

(75) Inventors: Hitoshi Nagata, Tokyo (JP); Toru Takeguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 90 days.

(21) Appl. No.: 11/830,474

(22) Filed: Jul. 30, 2007

(65) Prior Publication Data

US 2008/0029767 A1 Feb. 7, 2008

(30) Foreign Application Priority Data

Aug. 4, 2006 (JP) .............................. 2006-213024

(51) Int. Cl.
*H01L 27/105* (2006.01)
*H01L 21/84* (2006.01)

(52) U.S. Cl. .............................. 349/42; 349/43; 349/47; 257/72

(58) Field of Classification Search .......... 257/E29.117, 257/E29.151, 288; 349/42, 43
See application file for complete search history.

(56) References Cited

U.S. PATENT DOCUMENTS

| 6,160,272 | A | 12/2000 | Arai et al. |
| 6,207,481 | B1 | 3/2001 | Yi et al. |
| 6,692,997 | B2 * | 2/2004 | So et al. ..................... 438/151 |
| 6,836,299 | B2 * | 12/2004 | Chung et al. ................... 349/42 |
| 7,247,529 | B2 * | 7/2007 | Shoji et al. ................... 438/166 |
| 2005/0280748 | A1 * | 12/2005 | Ochiai et al. ................... 349/43 |

FOREIGN PATENT DOCUMENTS

| JP | 6-194689 | 7/1994 |
| JP | 10-177163 | 6/1998 |
| JP | 10-254383 | 9/1998 |
| JP | 2001-21920 | 1/2001 |
| JP | 2003-131260 | 5/2003 |
| KR | 2000-0061176 | 10/2000 |
| KR | 2002-0066574 | 8/2002 |

OTHER PUBLICATIONS

U.S. Appl. No. 11/673,773, filed Feb. 12, 2007, Nagata et al.
U.S. Appl. No. 11/758,925, filed Jun. 6, 2007, Nagata et al.
U.S. Appl. No. 11/778,382, filed Jul. 16, 2007, Nagata et al.
U.S. Appl. No. 11/830,474, filed Jul. 30, 2007, Nagata et al.

* cited by examiner

*Primary Examiner*—Leonardo Andújar
*Assistant Examiner*—William Harriston
(74) *Attorney, Agent, or Firm*—Oblon, Spivak, McClelland, Maier & Neustadt, L.L.P.

(57) ABSTRACT

A wiring layer includes a signal line and covers a predetermined portion on a source region and a drain region of a crystalline silicon layer. A gate insulating layer is on the crystalline silicon layer and the wiring layer. A gate electrode layer above the gate insulating layer includes a scanning line, a gate electrode corresponding to a channel region of the crystalline silicon layer, and a capacitor electrode corresponding to a predetermined portion of the wiring layer. The capacitor electrode is formed separately from the scanning line and the gate electrode and is configured to form a capacitor with the wiring layer. An interlayer insulating film is on the gate electrode layer and the gate insulating layer. A pixel electrode layer on the interlayer insulating film includes a pixel electrode connected to the wiring layer through a contact hole in the gate insulating layer and the interlayer insulating film.

10 Claims, 12 Drawing Sheets

103

DISPLAY DEVICE AND METHOD OF MANUFACTURING THE DISPLAY DEVICE

BACKGROUND OF THE INVENTION

1. Field of the Invention

The present invention relates to a display device and a method of manufacturing the display device. In particular, the invention relates to a display device including a thin film transistor having a crystalline silicon layer as a channel active layer.

2. Description of Related Art

In recent years, there have been developed active matrix display devices where plural signal lines and plural scanning lines are arranged in matrix, and a thin film transistor (TFT) as a switching element is formed in a pixel area surrounded by the signal lines and the scanning lines. The active matrix display devices excel passive matrix display devices in image quality and thus prevail over other organic EL display devices and liquid crystal display devices. A LTPS TFT including a channel active layer made of low temperature polysilicon (LTPS) has high electron mobility. Performances of the active matrix display devices have been dramatically improved using the LTPS TFT.

For example, the LTPS TFT is applied to a peripheral circuit portion for driving a switching element. If the LTPS TFT is used for peripheral circuits of the display device, it is possible to reduce the number of ICs and IC-equipped substrates for use in devices. As a result, the display device configuration can be simplified and a high-reliability display device with a narrow frame is realized.

Further, in the liquid crystal display devices, if the LTPS TFT is used as a switching element for each pixel, it is possible to reduce not only a capacitance thereof but an area of a storage capacitor connected to the drain side. Therefore, a liquid crystal display device (LCD) of high resolution and high aperture ratio can be attained. Thus, the LTPS TFT plays a leading role in displaying high-resolution images such as QVGA (240×320 pixels) or VGA (480×640 pixels) with a liquid crystal display device with a small panel like a cell phone display panel. In this way, the LTPS TFT is more advantageous than an amorphous silicon (a-Si) TFT in terms of performance.

However, existing LTPS TFTs have problems of many manufacturing steps and low productivity compared with the a-Si TFT. Here, a difference in manufacturing process between the a-Si TFT and the LTPS TFT is described in detail based on the LCD.

As a result of comparing a manufacturing process for an a-Si TFT LCD with that for an LTPS TFT LCD array, the number of patterning steps is 5 for the a-Si TFT LCD but is 8 for the LTPS TFT. A breakdown of the additional three patterning steps necessary for the LTPS TFT is as follows:

(1) a selective doping step for forming a C/MOS structure (unnecessary if the TFT structure is one-conductivity type: N type or P type)
(2) a doping step for reducing a resistance of a lower-electrode-formation polysilicon layer of a storage capacitor
(3) a step of forming contact holes for source/drain lines inclusive of a signal line.

The difference of 3 patterning steps largely influences productivity, and a production cost exceeds a low component cost for ICs and IC-equipped substrates, which is an advantage of the LTPS TFT LCD. As a result, the display device using the LTPS TFT is inferior in product competitiveness to the a-Si TFT. This problem is applicable to active matrix display devices other than the LCD, such as an active matrix organic EL display device (AMOLED).

To that end, Japanese Unexamined Patent Application Publication Nos. 6-194689 and 2003-131260 (Miyasaka) disclose a technique of forming a source/drain line below a gate insulating layer to directly contact a source/drain region in a silicon layer with the source/drain line to use the line as a lower electrode of a storage capacitor. As a result, it is possible to skip the aforementioned two steps: (2) doping step for reducing a resistance of a lower-electrode-formation polysilicon layer of a storage capacitor and (3) step of forming contact holes for source/drain lines. For example, the technique of Miyasaka directly connects the source/drain line with the silicon layer to reduce the number of steps.

The TFT structure of Miyasaka has a silicon layer formed on a metal line, and many defects occur in the LTPS TFT. The LTPS is generally obtained by forming an a-Si layer and locally-heating the a-Si layer surface with a laser to fuse and crystallize the a-Si layer. Under heating at high temperature, metal contamination proceeds from the base metal line to a silicon layer. Hence, a TFT junction in the silicon layer is deteriorated to increase a leak current.

Further, in general, an a-Si layer is heated by moving a laser beam which has linear spot in a laser annealing step. A crystal structure of a silicon layer differs between a case where a direction in which a region is heated with the linear spot of laser beam is vertical to a direction of a source/drain region having a metal line at the end portion and the case where the two directions are parallel to each other. A difference of the crystal structure causes a difference in TFT characteristics. If the TFT structure of Miyasaka is applied to the LTPS TFT, the TFT characteristics vary, and a current leaks and its reliability lowers due to the defects.

SUMMARY OF THE INVENTION

The present invention has been accomplished in view of the above circumstances, and it is an object of the present invention to provide a display device capable of suppressing variations in characteristics of a thin film transistor including a crystalline silicon layer as a channel active layer with a simple structure and a method of manufacturing the display device.

A display device according to an aspect of the present invention includes: a crystalline silicon layer formed on a substrate and including a source region, a drain region, and a channel region; a wiring layer including a signal line and formed to cover at least a predetermined portion on the source region and the drain region; a gate insulating layer formed on the crystalline silicon layer and the wiring layer; a gate electrode layer formed above the gate insulating layer and including a scanning line, a gate electrode corresponding to the channel region, and a capacitor electrode corresponding to a predetermined portion of the wiring layer; an interlayer insulating film formed on the gate electrode layer; and a pixel electrode layer formed on the interlayer insulating film, and including a pixel electrode connected to the drain region or the source region through a contact hole formed in the gate insulating layer and the interlayer insulating film.

A display device according to another aspect of the present invention includes: a crystalline silicon layer formed on a substrate and including a source region, a drain region, and a channel region; a wiring layer including a signal line and formed away from the crystalline silicon layer; a gate insulating layer formed on the crystalline silicon layer and the wiring layer; a gate electrode layer formed above the gate insulating layer and including a scanning line, a gate electrode corresponding to the channel region, and a capacitor electrode corresponding to a predetermined portion of the wiring layer; an interlayer insulating film formed on the gate electrode layer; and a pixel electrode layer formed on the interlayer insulating film, and including a pixel electrode connected to the drain region or the source region through a contact hole formed in the gate insulating layer and the interlayer insulating film.

A method of manufacturing a display device according to another aspect of the present invention includes: forming a crystalline silicon layer on a substrate; covering at least a predetermined portion on the crystalline silicon layer to form a wiring layer including a signal line; forming a gate insulating layer on the crystalline silicon layer and the wiring layer; forming a gate electrode layer including a scanning line, a gate electrode, and a capacitor electrode above the gate insulating layer; forming an interlayer insulating film on the gate electrode layer and the gate insulating layer; and forming a pixel electrode layer on the interlayer insulating film, and electrically connecting the pixel electrode layer and the wiring layer through a contact hole formed in the interlayer insulating film and the gate insulating layer.

A method of manufacturing a display device according to another aspect of the present invention includes: forming a crystalline silicon layer on a substrate; forming a wiring layer including the signal lines away from the crystalline silicon layer; forming a gate insulating layer on the crystalline silicon layer and the wiring layer; forming a gate electrode layer including a gate electrode, the scanning lines, and a capacitor electrode on the gate insulating layer; forming an interlayer insulating film on the gate electrode layer and the gate insulating layer; and forming a pixel electrode layer on the interlayer insulating film and electrically connecting the pixel electrode with the wiring layer and the crystalline silicon layer through a contact hole formed in the interlayer insulating film and the gate insulating layer.

According to the present invention, it is possible to provide a display device capable of suppressing variations in characteristics of a thin film transistor including a crystalline silicon layer as a channel active layer with a simple structure and a method of manufacturing the display device.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Hereinafter, embodiments of the present invention will be described. The following description about the embodiment of the present invention is given for illustrative purposes, and the present invention should not be construes as being limited to the following embodiments.

First Embodiment

Figure 1:
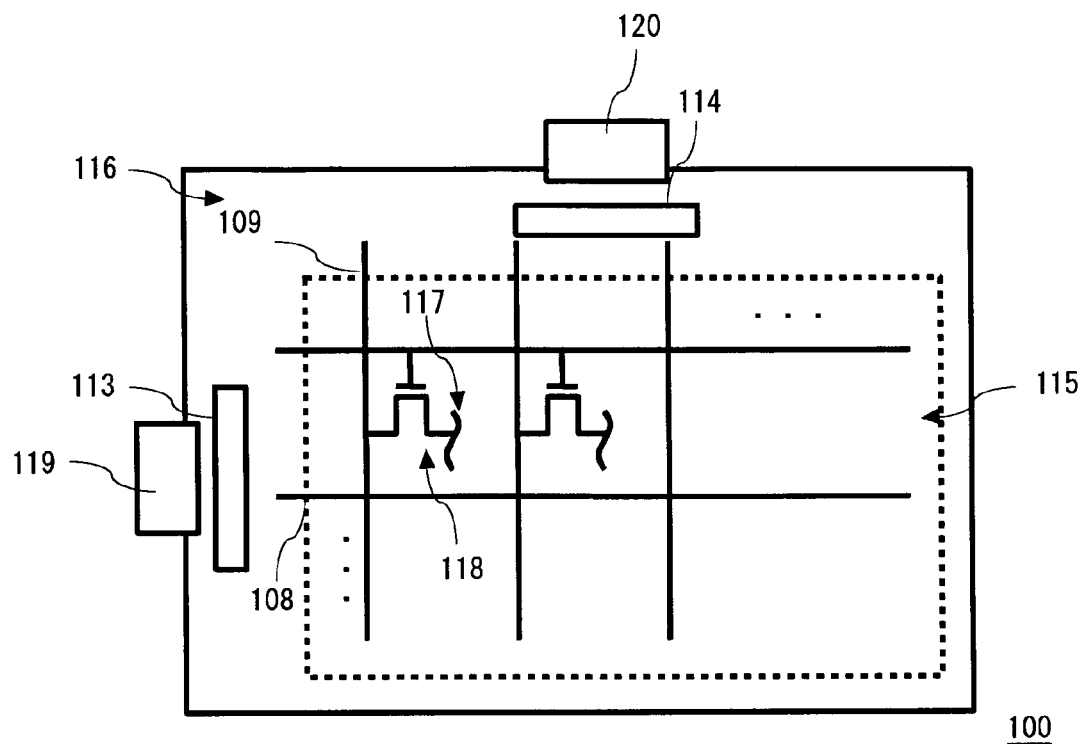
FIG. 1 is a plan view of the structure of a liquid crystal display device according to a first embodiment of the present invention.
Figure 2:
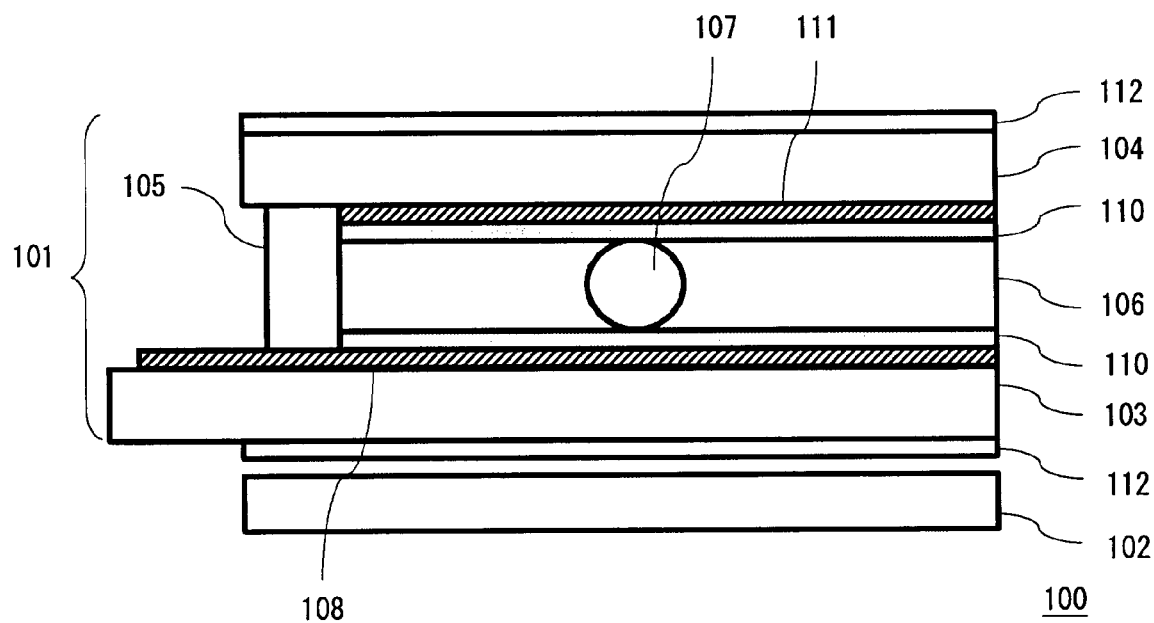
FIG. 2 is a sectional view of the structure of the liquid crystal display device of the first embodiment.

Referring to FIGS. 1 and 2, a display device according to a first embodiment of the present invention is described below. The display device of the present invention is an active matrix display device including a thin film transistor as a switching element. Here, a transmissive type active matrix liquid crystal display device is described as an example of the display device. FIG. 1 is a plan view of the structure of a liquid crystal display device 100 of this embodiment. FIG. 2 is a sectional view of the structure of the liquid crystal display device 100 of this embodiment. Incidentally, an opposing substrate or the like is omitted from FIG. 1 for ease of illustration.

As shown in FIGS. 1 and 2, the liquid crystal display device 100 includes a liquid crystal display panel 101 and a backlight 102. The liquid crystal display panel 101 displays an image based on an input display signal. The backlight 102 is placed on the opposite side to a display side of the liquid crystal display panel 101, and applies light from the rear side of the liquid crystal display panel 101. The liquid crystal display panel 101 includes a thin film transistor array substrate (TFT array substrate) 103, an opposing substrate 104, a seal member 105, a liquid crystal 106, a spacer 107, a gate line (scanning line) 108, a source line (signal line) 109, an orientation film 110, an opposing electrode 111, a polarizing plate 112, a gate driver IC 113, and a source driver IC 114. A feature of the present invention resides in the TFT array substrate 103 as described in detail later.

As shown in FIG. 1, the liquid crystal display device 100 of this embodiment includes the TFT array substrate 103. In the TFT array substrate 103, a display region 115 and a peripheral region 116 are formed. The peripheral region 116 is formed to surround the display region 115. In the display region 115, plural gate lines 108 and plural source lines 109 are formed. The plural gate lines 108 extend in parallel. Likewise, the plural source lines 109 extend in parallel. The gate lines 108 and the source lines 109 cross each other.

Further, thin film transistors (TFTs) 118 are formed at intersections between the gate lines 108 and the source lines 109. In the region surrounded by adjacent gate line 108 and source line 109, a pixel electrode (not shown) is formed. Hence, the region surrounded by the adjacent gate line 108 and source line 109 corresponds to a pixel 117. Thus, the pixels 117 are arranged in matrix on the TFT array substrate 103. The TFT 118 has a gate connected to the gate line 108, a source connected to the source line 109, and a drain connected to the pixel electrode. The pixel electrode is made up of a transparent conductive thin film, for example, an ITO (Indium Tin Oxide) film. The region having the plural pixels 117 corresponds to the display region 115.

As shown in FIG. 2, the liquid crystal display panel 101 is structured such that the liquid crystal 106 is filled in between the TFT array substrate 103, the opposing substrate 104 opposite to the TFT array substrate 103, and the seal member 105 bonding the two substrates. The two substrates are kept at a predetermined gap with the spacer 107. As the TFT array substrate 103 and the opposing substrate 104, for example, an insulating substrate made of glass transmissive of light, polycarbonate, or an acrylic resin can be used.

In the TFT array substrate 103, the orientation film 110 is formed on the above electrode and line. On the other hand, a color filter (not shown), a BM (Black Matrix) (not shown), the opposing electrode 111, and the orientation film 110 are formed on one surface of the opposing substrate 104, which opposes the TFT array substrate 103. Incidentally, the opposing electrode may be provided on the TFT array substrate 103. Further, the polarizing plate 112 is bonded to the outer surfaces of the TFT array substrate 103 and the opposing substrate 104.

As shown in FIG. 1, in the peripheral region 116 of the TFT array substrate 103, the gate driver IC 113 and the source driver IC 114 are provided. The gate line 108 extends from the display region 115 up to the peripheral region 116. Then, the gate line 108 is connected to the gate driver IC 113 at the end of the TFT array substrate 103. Likewise, the source line 109 extends from the display region 115 up to the peripheral region 116. Then, the source line 109 is connected to the source driver IC 114 at the end of the TFT array substrate 103. The external line 119 is connected near the gate driver IC 113. Further, the external line 120 is connected near the source driver IC 114. The external lines 119 and 120 constitute, for example, a wiring board such as an FPC (Flexible Printed Circuit).

Various signals are supplied from the outside to the gate driver IC 113 and the source driver IC 114 through the external lines 119 and 120. The gate driver IC 113 supplies a gate signal (scanning signal) from the outside to the gate line 108 based on an external control signal. In accordance with the gate signal, the gate lines 108 are successively selected. The source driver IC 114 supplies a display signal to the source line 109 based on an external control signal and display data. Hence, a display voltage corresponding to the display data can be supplied to each pixel electrode.

Incidentally, in this example, the gate driver IC 113 and the source driver IC 114 are directly mounted onto the TFT array substrate 103 with a COG (Chip On Glass) technique, but the present invention is not limited to this structure. For example, the driver IC may be connected to the TFT array substrate 103 with the TCP (Tape Carrier Package).

On the rear side of the liquid crystal display panel 101, the backlight 102 is provided. The backlight 102 applies light to the liquid crystal display panel 101 from the opposite side to the display side of the liquid crystal display panel 101. As the backlight 102, for example, a general backlight including a light source, a light guide plate, a reflection sheet, a diffusing sheet, a prism sheet, reflection polarizing sheet, and the like can be used.

Here, a method of driving the liquid crystal display device 100 is described. In each gate line 108, the gate driver IC 113 supplies scanning signals. All TFTs 118 connected to one gate line 108 are turned on in accordance with each scanning signal. Then, the source driver IC 114 supplies a display signal to each source line 109, and charges corresponding to the display signal are accumulated in the pixel electrode. A liquid crystal alignment direction is changed between the pixel electrode and the opposing electrode 111 in accordance with a potential difference between the pixel electrode to which the display signal is written and the opposing electrode 111. As a result, an amount of light transmitted through the liquid crystal display panel 101 is changed. A display voltage is made to vary from one pixel 117 to another to thereby display a desired image.

Figure 3:
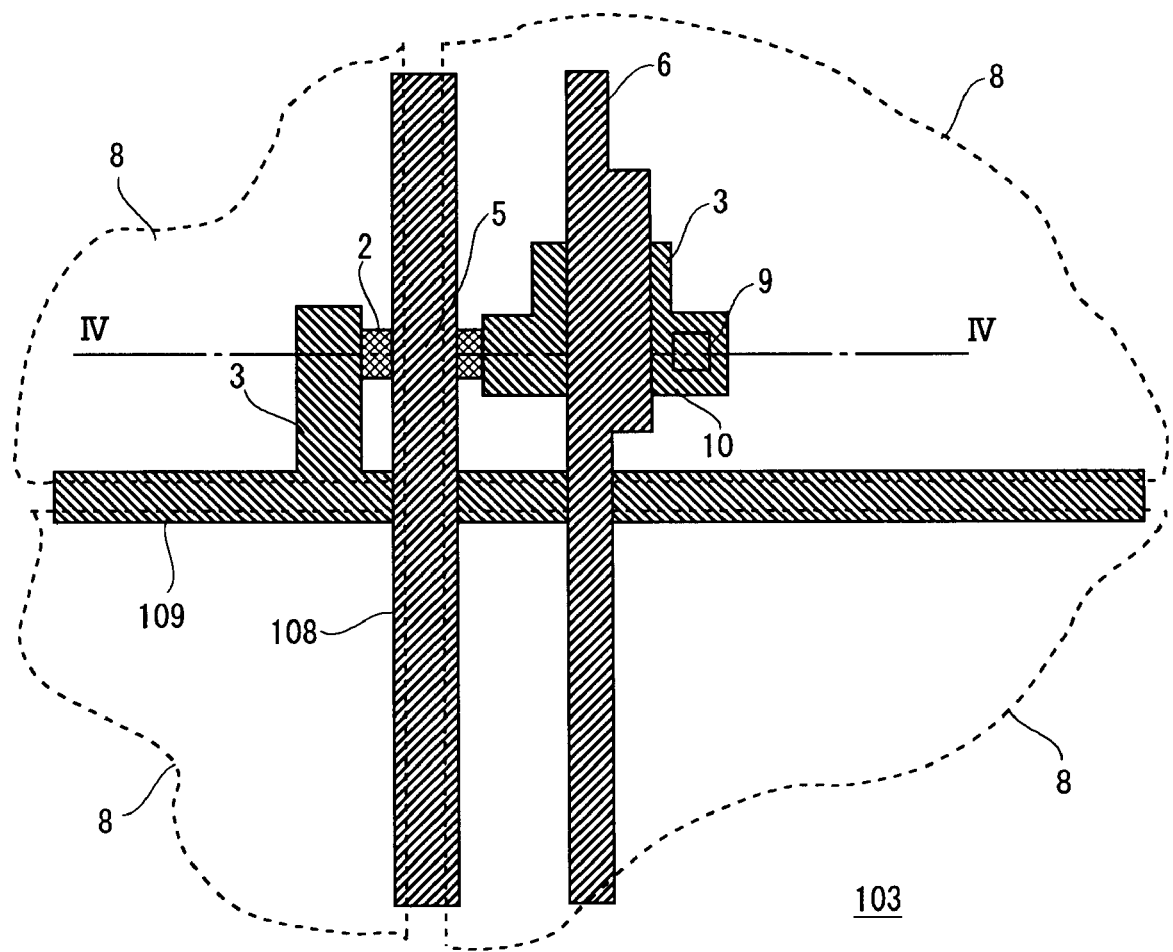
FIG. 3 is a plan view of the structure of a TFT array substrate of the first embodiment.
Figure 4:
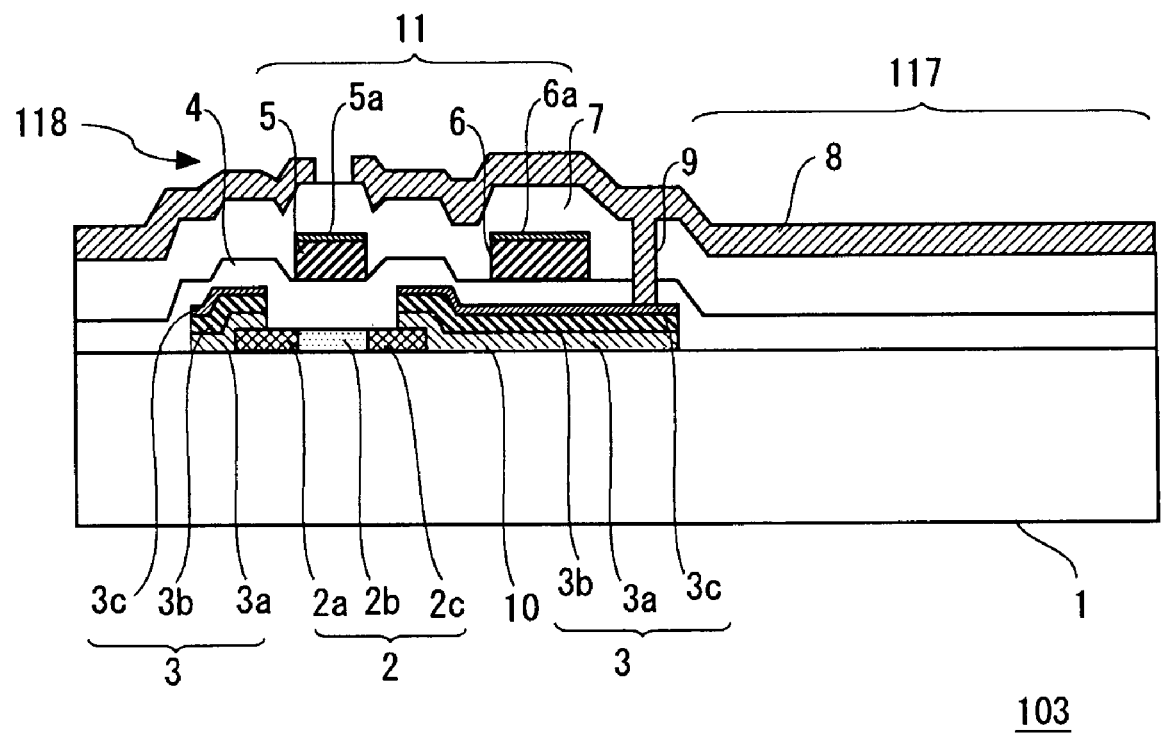
FIG. 4 is a sectional view taken along the line IV-IV of FIG. 3.

Referring now to FIGS. 3 and 4, the TFT array substrate 103 used in the liquid crystal display device 100 of this embodiment is described in detail. FIG. 3 is a plan view of the structure of the top-gate type TFT 118 formed on the TFT array substrate 103 of this embodiment and its vicinities. FIG. 4 is a sectional view taken along the line IV-IV of FIG. 3. In this embodiment, low temperature polysilicon (LTPS) as crystalline silicon is used for a channel active layer of the TFT 118 formed on the TFT array substrate 103.

As shown in FIGS. 3 and 4, the TFT array substrate 103 includes an insulating substrate 1, a polysilicon layer 2, a wiring layer 3, a gate insulating layer 4, a gate electrode 5, a capacitor electrode 6, an interlayer insulating film 7, a pixel electrode layer 8, a contact hole 9, and a connection pad 10. Here, the wiring layer 3 includes a source line (signal line) 109 and a connection pad 10. Further, the gate electrode layer 11 includes the gate line (scanning line) 108, the gate electrode 5, and the capacitor electrode 6. Further, the pixel electrode layer 8 may include a pixel electrode and function as a line.

As the insulating substrate 1, a glass substrate or conductive substrate having a protective insulating film formed thereof may be used. On the insulating substrate 1, the polysilicon layer 2 is formed. The polysilicon layer 2 includes a source region 2a, a channel region 2b, and a drain region 2c. Further, on the insulating substrate 1, the wiring layer 3 is formed on a part of the source region 2a and drain region 2c of the polysilicon layer 2. That is, the wiring layer 3 extends from the polysilicon layer 2 to the insulating substrate 1. A portion of the wiring layer 3 corresponding to the source region 2a is the source line 109. Further, a portion of the wiring layer 3 corresponding to the drain region 2c is the connection pad 10. Therefore, the wiring layer 3 functions as the source line 109 and functions to constitute a predetermined circuit between the TFT 118, the storage capacitor, and the pixel electrode layer 8.

As shown in FIG. 4, the wiring layer 3 has a three-layer structure including an underlying silicon layer 3a, a conductive layer 3b, and an interfacial conductive layer 3c. At an interface with the polysilicon layer 2 of the wiring layer 3, the underlying silicon layer 3a is formed. As the underlying silicon layer 3a, an amorphous or microcrystal silicon containing a conductive impurity of the same conductivity type as the source region 2a and drain region 2c of the polysilicon layer 2 can be used. That is, the wiring layer 3 is composed of at least the underlying silicon layer 3a, and the conductive layer 3b and interfacial conductive layer 3c formed thereon. The underlying silicon layer 3a next to the source region 2a and drain region 2c is a silicon film containing a conductive impurity. Further, the conductive layer 3b and interfacial conductive layer 3c formed on the underlying silicon layer 3a are metal films.

As a material for the conductive layer 3b, a material resistant to subsequent heat treatment is preferred, and a refractory and conductive material can be used. For example, the conductive layer 3b preferably contains at least one of Ti, Cr, Zr, Ta, W, Mo, TiN, ZrN, TaN, WN, and VN. Incidentally, a line resistance largely contributes to a circuit performance. Thus, if it is necessary to reduce a line resistance, the wiring layer 3 may mainly contain Al or Cu. At this time, the interfacial conductive layer 3c is formed on the conductive layer 3b. As the interfacial conductive layer 3c, the layer preferably contains at least one of Ti, Cr, Zr, Ta, W, Mo, TiN, ZrN, TaN, WN, and VN. That is, refractory metal or metal compounds are used at the interface with the pixel electrode layer 8 of the wiring layer 3 as described later.

Incidentally, in this embodiment, the wiring layer 3 has a three-layer structure composed of the underlying silicon layer 3a, the conductive layer 3b, and the interfacial conductive layer 3c, but the present invention is not limited thereto. For example, the wiring layer 3 may have a single-layer structure made of a refractory and conductive material. Further, the layer may be a two-layer structure composed of the underlying silicon layer 3a and the conductive layer 3b made of a refractory and conductive material.

Further, in the case of using Cu as a material for the conductive layer 3b without forming the underlying silicon layer 3a, contamination of the polysilicon layer 2 becomes a problem. In this case, it is preferred to form the interfacial conductive layer 3c above and below the conductive layer 3b. That is, the conductive layer 3b is sandwiched between the interfacial conductive layers 3c. That is, refractory metal such as Ti or metal compounds are used at an interface between the polysilicon layer 2 of the wiring layer 3 and the pixel electrode layer 8.

As described above, the polysilicon layer 2 is formed below the wiring layer 3, and the underlying silicon layer 3a or refractory metal is formed at the interface with the polysilicon layer 2 of the wiring layer 3. Hence, there is a fear that metal contamination proceeds from the wiring layer 3 to the polysilicon layer 2 with heat of a laser used for forming the polysilicon layer 2. Hence, it is possible to prevent such a situation that a junction of the TFT formed in the silicon layer is deteriorated to increase a leak current.

The gate insulating layer 4 is formed on the polysilicon layer 2 and wiring layer 3. As the gate insulating layer 4, it is important to form a trap level of an electron or hole at the interface with the polysilicon layer 2. As the gate insulating layer 4, a silicon oxide film or the like can be used. Further, on the gate insulating layer 4, the gate electrode 5 is formed in accordance with the channel region 2b of the polysilicon layer 2. Further, on the gate insulating layer 4, the capacitor electrode 6 is formed in accordance with the connection pad 10 as apart of the wiring layer 3. The gate electrode 5 and capacitor electrode 6 are formed in the same layer. As shown in FIG. 3, the gate electrode 5 is used as the gate line 108 as well. Further, the capacitor electrode 6 is also used as the common potential line for supplying a common potential to the opposing electrode 111. The gate electrode 5, the capacitor electrode 6, and the gate line 108 constitute the gate electrode layer 11.

To self-align the gate electrode 5 and the channel region 2b, it is preferred to form the gate electrode 5 and then form the source region 2a and drain region 2c through selective ion implantation with the gate electrode 5 used as a mask. Thus, a parasitic capacitance of the TFT can be reduced. Incidentally, in the polysilicon layer 2 below the wiring layer 3, an amount of implanted ions is small, but the underlying silicon layer 3a can reduce an electrical-connection resistance of the wiring layer 3, and the source region 2a and drain region 2c. Further, the underlying silicon layer 3a has the same conductivity type as the source region 2a and drain region 2c, and a leak current supplied when the TFT 118 is turned off can be suppressed.

Further, the capacitor electrode 6 is formed on the connection pad 10 as a part of the wiring layer 3 through the gate insulating layer 4 to thereby use the connection pad 10 as a lower electrode of the capacitor. That is, a capacitor can be formed with the capacitor electrode 6 used as an upper electrode, the gate insulating layer 4 used as the capacitor insulating film, and the connection pad 10 used as the lower electrode. As a result, a doping step for forming the lower electrode of the capacitor can be skipped as in the related art. Incidentally, as a capacitor insulating film, a material other than the material of the gate insulating layer 4 can be used, or the film thickness of the capacitor insulating film is changed to change the capacitor capacitance.

As shown in FIG. 4, on the gate electrode layer 11, the interlayer insulating film 7 is formed. The interlayer insulating film 7 is formed to prevent hydrogen from spreading from the lower layer of the interlayer insulating film 7. If hydrogen is spread from the lower layer of the interlayer insulating film 7, dangling bonds of silicon atoms increase to considerably deteriorate TFT characteristics (threshold voltage Vth, electron mobility, etc.). However, the interlayer insulating film 7 formed on the gate electrode layer 11 can suppress an increase in dangling bonds of silicon atoms in the polysilicon layer 2 and at the interface between the polysilicon layer 2 and the gate insulating layer 4 due to hydrogen distortion. The interlayer insulating film 7 preferably includes at least a silicon nitride film. Further, hydrogen is diffused through heat treatment after the formation of the interlayer insulating film 7 to further reduce dangling bonds of silicon atoms.

On the interlayer insulating film 7, the pixel electrode layer 8 is formed. The pixel electrode layer 8 is electrically connected to the gate electrode layer 11 and wiring layer 3 through the contact hole 9 passed through the interlayer insulating film 7 and gate insulating layer 4. In this embodiment, since the transmissive type liquid crystal display device 100 is used, as the pixel electrode layer 8, a transparent electrode made of ITO, IZO, or ITZO is used.

Incidentally, if a bottom-emission type organic EL display device is used, a transparent electrode made of ITO, IZO, or ITZO as the pixel electrode layer 8 similar to the transmissive type liquid crystal display device. Further, if a reflective type liquid crystal display device is used, a reflection electrode made of Al or Ag is used as the pixel electrode layer 8. Further, if the top-emission type organic EL display device is used, as the pixel electrode layer 8, a laminate of a transparent electrode made of ITO, IZO, or ITZO, and a reflection electrode made of a high-reflection material such as Al or Ag is used.

In order that the pixel electrode layer 8 is securely electrically connected to the gate electrode layer 11 and wiring layer 3, an interfacial conductive layer is preferably formed on the gate electrode layer 11 and wiring layer 3. Therefore, in this embodiment, the interfacial conductive layer 3c is formed on the wiring layer 3, the interfacial conductive layer 5a is formed on the gate electrode 5, and the interfacial conductive layer 6a is formed on the capacitor electrode 6. The interfacial conductive layer preferably contains at least one of Ti, Cr, Zr, Ta, W, Mo, TiN, ZrN, TaN, WN, and VN as described above.

Figure 5A:
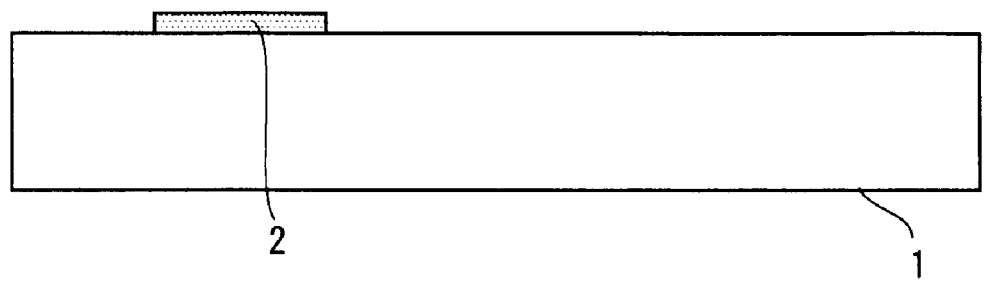
FIG. 5A is a manufacturing process diagram for explaining a method of manufacturing a liquid crystal display device of the first embodiment.

Referring now to FIGS. 5A to 5E, a method of manufacturing the liquid crystal display device 100 is described. FIGS. 5A to 5E are manufacturing process diagrams for explaining the method of manufacturing the liquid crystal display device 100 of this embodiment. As shown in FIG. 5A, the polysilicon layer 2 is formed first on the insulating substrate 1. To be specific, an amorphous silicon film is formed on the insulating substrate 1 through plasma CVD (PECVD: Plasma Enhanced Chemical Vapor Deposition), and XeCl excimer laser light (wavelength: 308 nm) or YAG2ω laser light (wavelength: 532 nm) is applied to transform the amorphous silicon film into a polysilicon film. The polysilicon film is photoetched into a predetermined shape to thereby form the polysilicon layer 2.

Figure 5B:
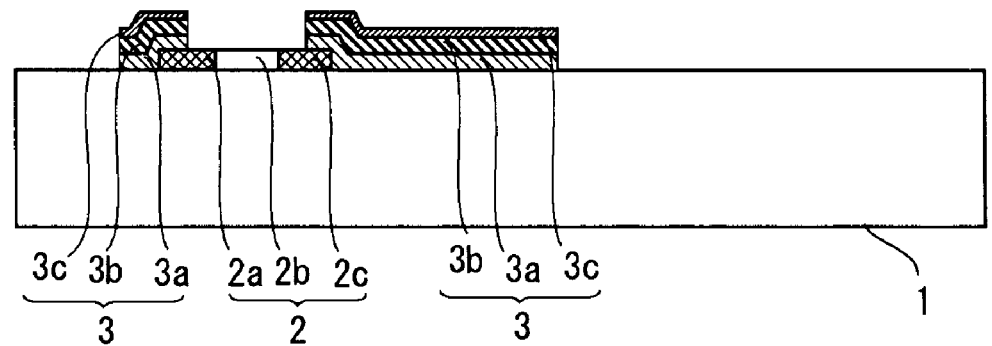
FIG. 5B is a manufacturing process diagram for explaining a method of manufacturing a liquid crystal display device of the first embodiment.

As shown in FIG. 5B, on the insulating substrate 1 having the polysilicon layer 2 formed thereon, the wiring layer 3 is formed next. To be specific, an amorphous silicon film or microcrystal silicon film containing conductive impurities is deposited through PECVD. The underlying silicon layer 3a is formed. The conductive impurities are injected as follows: diborane ($B_2H_6$) is doped in the case of injecting a p-type impurity or phosphine ($PH_3$) is mixed with silane ($SiH_4$) and doped in the case of injecting an n-type impurity under PECVD. The concentration of the conductive impurity is determined based on concentrations of mixed gases, and diborane and phosphine is preferably diluted with hydrogen etc. beforehand. The microcrystal silicon film is formed by a combination between optimization of an amount of hydrogen diluents upon PECVD and hydrogen plasma treatment. The microcrystal silicon film may be formed through ICP (Inductive Coupled Plasma) CVD as well. Further, a silicon tetrafluoride ($SiF_4$) may be used in place of the silane.

After that, a material for the wiring layer 3 including the source line 109 is deposited on the underlying silicon layer 3a through sputtering. As described above, as the wiring layer 3, a material resistant to subsequent heat treatment with high property of electrical connection with the pixel electrode layer 8 is used. Alternatively, as described above, Al, Cu, or the like may be used for the conductive layer 3b to reduce the line resistance and covered with the interfacial conductive layer 3c.

In this way, after depositing a material for the wiring layer 3 composed of the underlying silicon layer 3a, the conductive layer 3b, and the interfacial conductive layer 3c on the insulating substrate 1, a predetermined pattern is formed through photoetching. The wiring layer 3 can be formed into a predetermined pattern through dry etching with varying etching gases and conditions, but the conductive layer 3b and interfacial conductive layer 3c of the wiring layer 3 can be formed through wet etching. Further, it is necessary to appropriately determine the kind of the underlying silicon layer 3a so as to execute selective etching by utilizing a difference in etching rate from the lower polysilicon layer 2. At this time, the wiring layer 3 is partially formed on a part of the polysilicon layer 2. Then, the wiring layer 3 extends from the polysilicon layer 2 to the insulating substrate 1.

Figure 5C:
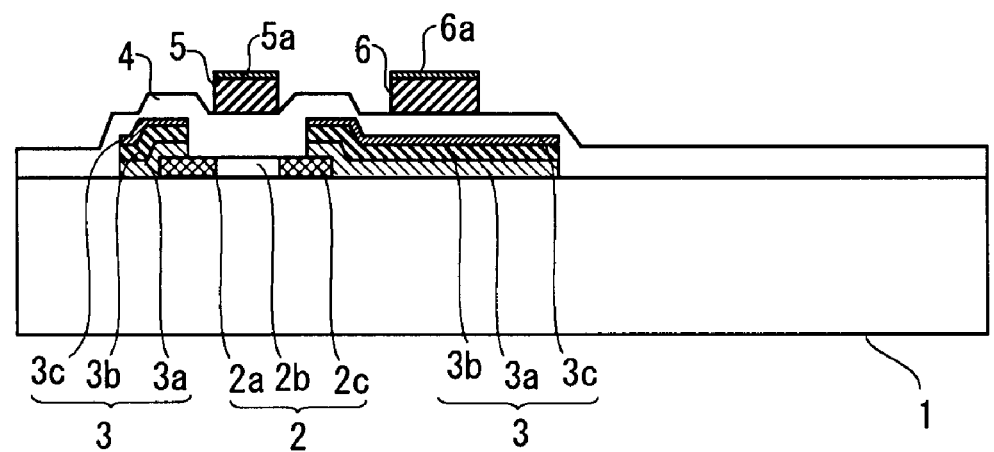
FIG. 5C is a manufacturing process diagram for explaining a method of manufacturing a liquid crystal display device of the first embodiment.

After that, as shown in FIG. 5C, the gate insulating layer 4 is formed to cover the polysilicon layer 2 and wiring layer 3. As the gate insulating layer 4, an $SiO_2$ film is preferably formed through PECVD using TEOS (Tetra Ethyl Ortho Silicate). Then, the gate electrode layer 11 including the gate electrode 5, the capacitor electrode 6, and the gate line 108 is formed on the gate insulating layer 4. The gate electrode layer 11 needs to have high property of electrical connection with the pixel electrode layer 8. For example, if the pixel electrode layer 8 is ITO, an Mo alloy or Al alloy having high property of electrical connection with ITO can be selected. Further, the interfacial conductive layers 5a and 6a made of, for example, TiN having high property of electrical connection with ITO may be formed on the gate electrode layer 11.

After the completion of depositing the gate electrode layer 11, the gate electrode 5 and capacitor electrode 6 are patterned into a predetermined shape through photoetching. As the etching, wet etching or dry etching may be performed. As a result, the gate electrode 5 and the polysilicon layer 2 are formed face to face through the gate insulating layer 4. Further, the capacitor electrode 6 and the connection pad 10 as a part of the wiring layer 3 are formed face to face through the gate insulating layer 4. That is, the capacitor electrode 6 overlaps with a part of the connection pad 10.

After the formation of the gate electrode 5, ions are selectively implanted to the source region 2a and drain region 2c with the gate electrode 5 used as a mask to self-align the gate electrode 5 and the channel region 2b of the polysilicon layer 2. As a result, the source region 2a and drain region 2c are formed in the polysilicon layer 2. Incidentally, an amount of implanted ions is small in the polysilicon layer 2 below the wiring layer 3, but the underlying silicon layer 3a can reduce an electrical-connection resistance of the wiring layer 3, and the source region 2a and drain region 2c.

Further, the capacitor electrode 6 is formed in accordance with the connection pad 10 as a part of the wiring layer 3 on the gate insulating layer 4 to thereby form a capacitor having the capacitor electrode 6 as the upper electrode and the connection pad 10 as the lower electrode. At this time, the gate insulating layer 4 formed between the capacitor electrode 6 and the connection pad 10 is a capacitor insulating layer. Incidentally, as the capacitor insulating layer, materials other than the material for the gate insulating layer 4 can be used. Further, the film thickness of the capacitor insulating film is set different from the film thickness of the gate insulating layer 4 to thereby change the capacitor capacitance.

Figure 5D:
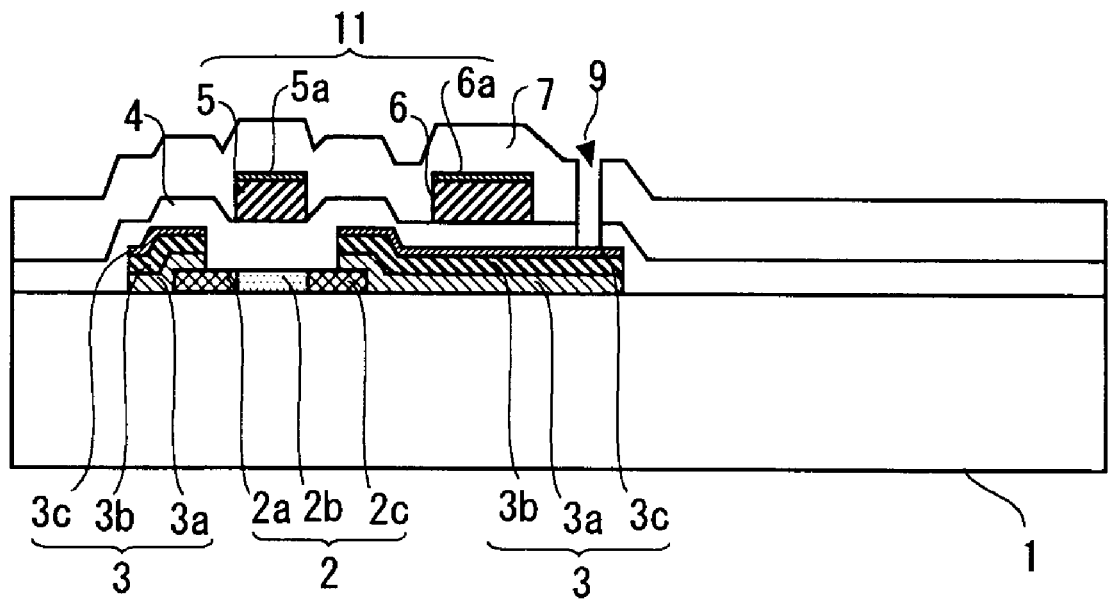
FIG. 5D is a manufacturing process diagram for explaining a method of manufacturing a liquid crystal display device of the first embodiment.

As shown in FIG. 5D, the interlayer insulating film 7 is formed to cover the gate insulating layer 4 and the gate electrode layer 11. As the interlayer insulating film 7, as described above, a film for preventing hydrogen from diffusing, that is, a film including a silicon nitride film formed through PECVD can be used. Further, as the interlayer insulating film 7, a two-layer structure having a silicon oxide film formed through PECVD with TEOS as a lower layer and a silicon nitride film formed through PECVD as an upper layer is further preferred.

Then, the contact hole 9 is formed in a predetermined position of the interlayer insulating film 7 and gate insulating layer 4. Thus, the connection pad 10 is partially exposed. The contact hole 9 can be formed through dry etching. In general, in the case of the interlayer insulating film 7 including the silicon oxide film or silicon nitride film, a dry etching selectivity between the interlayer insulating film 7 and the polysilicon layer 2 is low. Thus, if the contact hole is directly formed on the polysilicon layer 2 as in the related art, up to the polysilicon layer 2 is etched. However, according to this embodiment, the contact hole 9 is not directly formed on the polysilicon layer 2 but on the wiring layer 3 connected to the polysilicon layer 2. Therefore, the contact hole 9 of a stable shape can be formed.

Figure 5E:
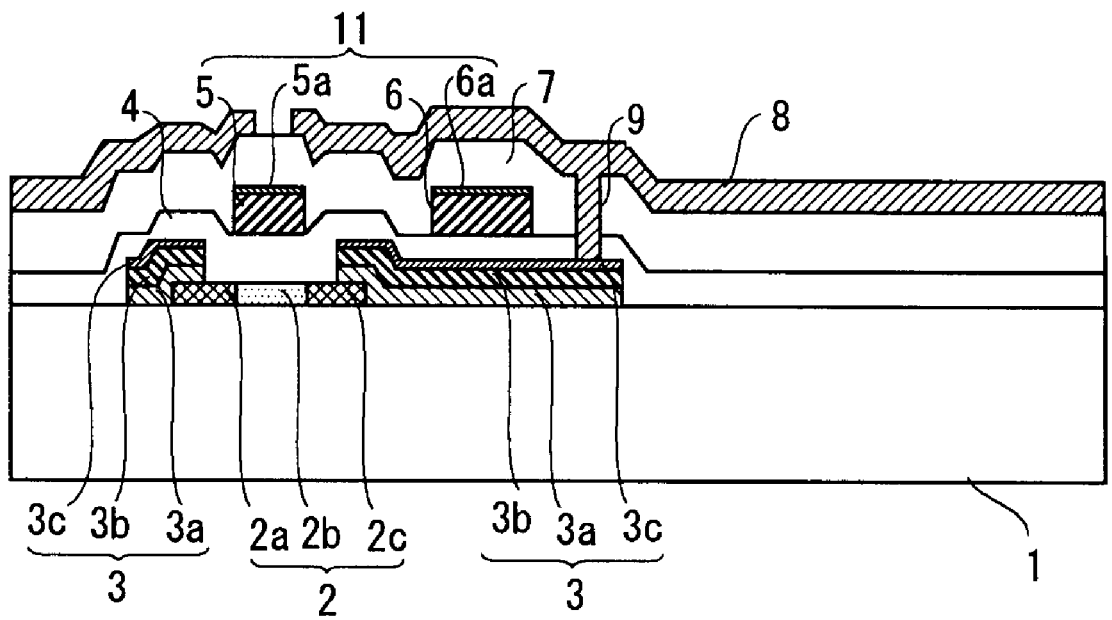
FIG. 5E is a manufacturing process diagram for explaining a method of manufacturing a liquid crystal display device of the first embodiment.

After that, as shown in FIG. 5E, the pixel electrode layer 8 including the pixel electrode is formed on the interlayer insulating film 7. As a result, the pixel electrode of the pixel electrode layer 8 is electrically connected to the connection pad 10 as a part of the wiring layer 3 through the contact hole 9 passed through the interlayer insulating film 7 and gate insulating layer 4. Further, although not shown, a part of the pixel electrode layer 8 is electrically connected to a terminal formed at the end of the insulating substrate 1. As the pixel electrode layer 8, as described above, a transparent electrode made of ITO or the like can be used. Then, a pixel electrode material deposited on the interlayer insulating film 7 is photoetched into a predetermined shaped to form the pixel electrode and the like.

In this way, the TFT array substrate 103 is completed. After that, the thus-formed TFT array substrate is used to form the liquid crystal panel 101, and the backlight 102, the gate driver IC 113, the source driver IC 114, and the like are mounted to obtain the liquid crystal display device 100 of this embodiment.

As described above, in the method of manufacturing a liquid crystal display device according to the present invention, the wiring layer 3 can be partially used as the lower electrode of the storage capacitor. Thus, it is unnecessary to execute a doping step for reducing a resistance of a polysilicon layer for the lower electrode of the storage capacitor unlike the related art. Further, the wiring layer 3 is directly formed above the source region 2a and drain region 2c of the polysilicon layer 2, so a step of forming the contact hole for the source/drain line can be omitted. As described above, a manufacturing step can be skipped and productivity can be improved.

Second Embodiment

Figure 6:
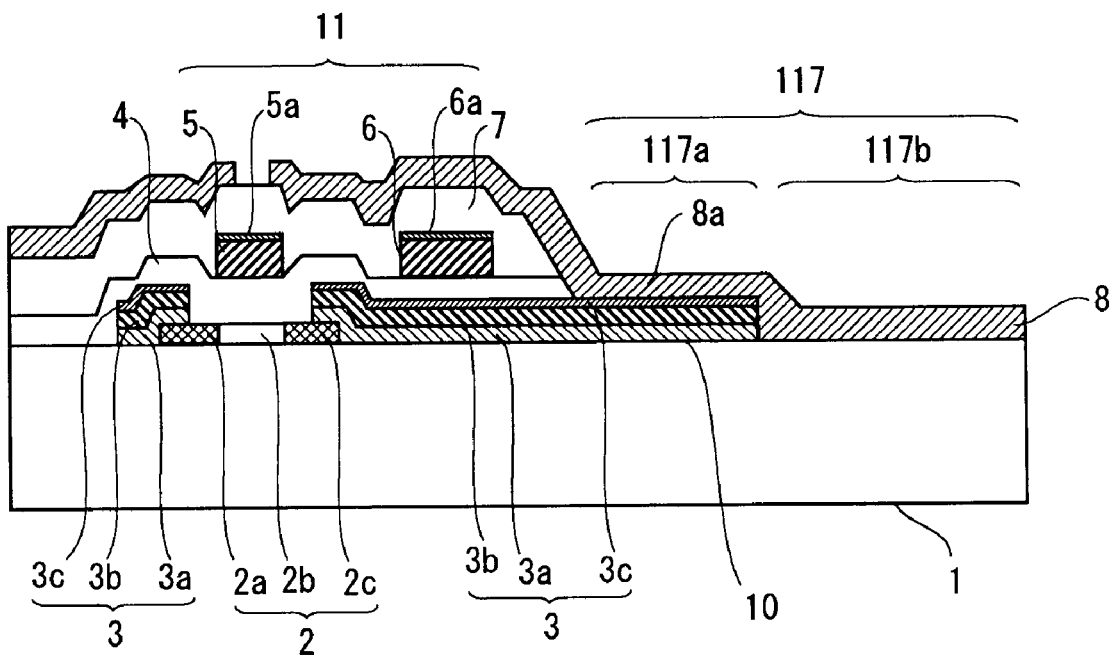
FIG. 6 is a sectional view of the structure of a TFT array substrate according to a second embodiment of the present invention.

Referring to FIG. 6, a display device according to a second embodiment of the present invention is described next. FIG. 6 is a sectional view of the structure of the TFT array substrate 103 used in the liquid crystal display device 100 of this embodiment. This embodiment differs from the first embodiment in that the pixel electrode layer 8 partially comes into contact with the insulating substrate 1, and the pixel electrode layer 8 is connected with the wiring layer 3 near a region where the pixel electrode layer 8 comes into contact with the insulating substrate 1. Further, the liquid crystal display device 100 of this embodiment is suitable for a transflective type liquid crystal display device with the wiring layer 3 used as a reflection electrode and the pixel electrode layer 8 used as a transparent electrode. Thus, this embodiment describes the transflective type liquid crystal display device 100. In FIG. 6, the same components as those of FIG. 4 are denoted by identical reference numerals and description thereof is omitted. Further, in this embodiment, as for components other than the TFT array substrate 103, the components of FIGS. 1 and 2 can be used. Thus, in this example, the structure of the TFT array substrate 103 as shown in FIG. 6 is described.

As shown in FIG. 6, the TFT array substrate 103 of this embodiment includes the insulating substrate 1, the polysilicon layer 2, the wiring layer 3, the gate insulating layer 4, the gate electrode 5, the capacitor electrode 6, the interlayer insulating film 7, the pixel electrode layer 8, the connection pad 10, the gate electrode layer 11, and the like. The polysilicon layer 2 including the source region 2a, the channel region 2b, and the drain region 2c is formed on the insulating substrate 1. The wiring layer 3 is formed on a part of the polysilicon layer 2. The source line 109 as a part of the wiring layer 3 extends from the source region 2a of the polysilicon layer 2 to the insulating substrate 1. Further, the connection pad 10 as a part of the wiring layer 3 extends from the drain region 2c of the polysilicon layer 2 to the insulating substrate 1. Incidentally, the pixel electrode layer 8 is formed on the insulating substrate 1 as described below. Further, the pixel electrode layer 8 is formed on the interlayer insulating film 7 and the wiring layer 3. That is, the pixel electrode layer 8 extends from the interlayer insulating film 7 to the wiring layer 3 and the insulating substrate 1.

In this embodiment, the wiring layer 3 is made of a material having reflection characteristics. For example, the conductive layer 3b of the wiring layer 3 may be formed of Al, Ag, or the like. Then, the wiring layer 3 has a three-layer structure including the underlying silicon layer 3a, the conductive layer 3b, and the interfacial conductive layer 3c as described in the first embodiment. Hence, a part of the connection pad 10 in the wiring layer 3 can be used as a reflection electrode.

The gate insulating layer 4 is formed on the polysilicon layer 2 and the wiring layer 3. Further, the gate insulating layer 4 is formed on a part of the connection pad 10. In the region of the connection pad 10 having no gate insulating layer 4, the pixel electrode layer 8 is directly formed. That is, the connection pad 10 and the pixel electrode layer 8 are directly connected. As described above, in this embodiment, a relatively large area can be set aside for connecting the wiring layer 3 for supplying an image signal to the pixel electrode layer 8 and the pixel electrode layer 8. Further, it is unnecessary to form a contact hole for connecting the pixel electrode layer 8 and the connection pad 10. However, in place of the contact hole for connecting the wiring layer 3 and the pixel electrode layer 8, although not shown in FIG. 6, a contact hole should be formed in the interlayer insulating film 7 as described below to connect the wiring layer 3 and the gate electrode 5. The contact hole can be formed through the same number of manufacturing steps as that of the first embodiment as shown in of FIG. 4.

On the gate insulating layer 4, the gate electrode layer 11 including the gate electrode 5 and capacitor electrode 6 are formed. On the gate insulating layer 4, the gate electrode 5 is formed in accordance with the channel region 2b of the polysilicon layer 2, and the capacitor electrode 6 is formed in accordance with the connection pad 10 of the wiring layer 3. Thus, in this embodiment, the connection pad 10 as a part of the wiring layer can be used as a lower electrode of the capacitor. Hence, two steps of a doping step for reducing a resistance of a polysilicon layer for the lower electrode of the storage capacitor and the step of forming the contact hole for the source/drain line can be skipped.

On the gate electrode layer 11, the interlayer insulating film 7 is formed. Then, the pixel electrode layer 8 is formed on the interlayer insulating film 7. Hence, as described above, the pixel electrode layer 8 extends from the interlayer insulating film 7 to the connection pad 10 and the insulating substrate 1. As the pixel electrode layer 8, a transparent conductive material made of ITO or the like is used. A region having the connection pad 10 and pixel electrode 8a as the reflection electrode out of the pixels 117 surrounded by the gate line 108 and the source line 109 is a reflection region 117a. Further, a region having the pixel electrode 8a as the transparent electrode out of the pixels 117 where no connection pad 10 is formed is a transmissive region 117b.

At this time, the pixel electrode layer 8 on the connection pad 10 as the reflection electrode is preferably removed as much as possible. As a result, reflectivity of the connection pad 10 as the reflection electrode can be increased, and brightness in a reflection mode can be improved. Further, the interfacial conductive layer 3c on the connection pad 10 as the reflection electrode is removed to further increase the reflectivity.

Third Embodiment

Figure 7:
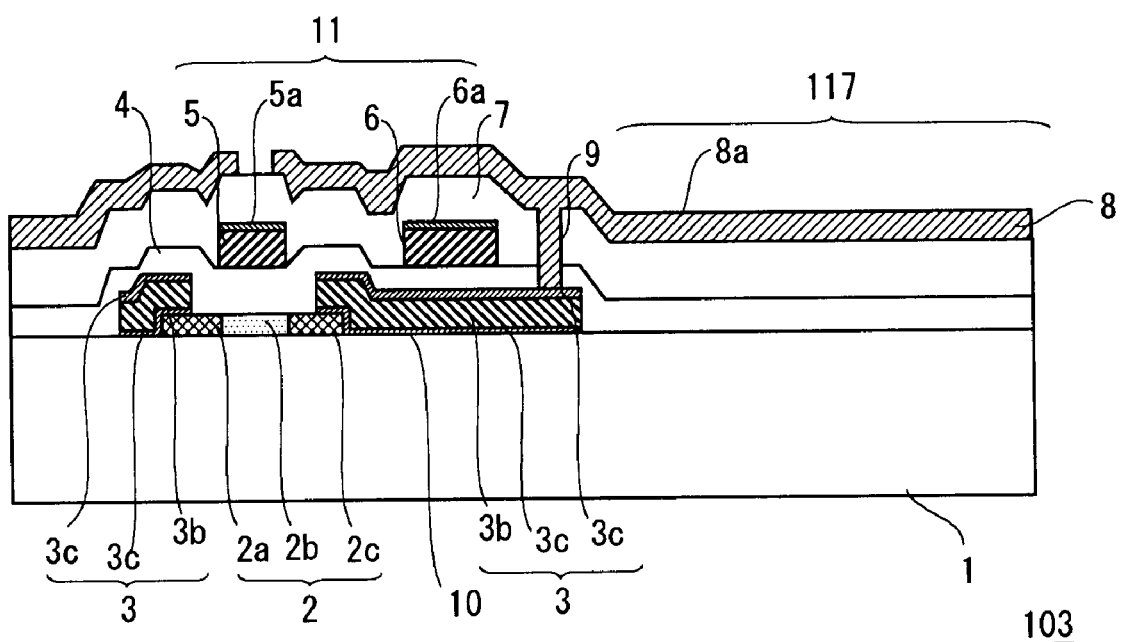
FIG. 7 is a sectional view of the structure of a TFT array substrate according to a third embodiment of the present invention.

Referring to FIG. 7, a display device according to a third embodiment of the present invention is described. FIG. 7 is a sectional view of the structure of the TFT array substrate 103 used in the liquid crystal display device 100 of this embodiment. This embodiment differs from the first embodiment in that an interfacial conductive layer 3c is formed in place of the underlying silicon layer 3a formed at the interface with the polysilicon layer 2 of the wiring layer 3. In FIG. 7, the same components as those of FIG. 4 are denoted by identical reference numerals and description thereof is omitted. Further, in this embodiment, as for components other than the TFT array substrate 103, the components of FIGS. 1 and 2 can be used. Thus, in this example, the structure of the TFT array substrate 103 of FIG. 7 is described below.

As shown in FIG. 7, the TFT array substrate 103 of this embodiment includes the insulating substrate 1, the polysilicon layer 2, the wiring layer 3, the gate insulating layer 4, the gate electrode 5, the capacitor electrode 6, the interlayer insulating film 7, the pixel electrode layer 8, the connection pad 10, the gate electrode layer 11, and the like. The polysilicon layer 2 including the source region 2a, the channel region 2b, and the drain region 2c is formed on the insulating substrate 1. The wiring layer 3 is formed on a part of the polysilicon layer 2. The source line 109 as a part of the wiring layer 3 extends from the source region 2a of the polysilicon layer 2 to the insulating substrate 1. Further, the connection pad 10 as a part of the wiring layer 3 extends from the drain region 2c of the polysilicon layer 2 to the insulating substrate 1. In this embodiment, at the interface with the polysilicon layer 2 of the wiring layer 3, no underlying silicon layer 3a is formed. That is, the wiring layer 3 may have a three-layer structure where the conductive layer 3b is sandwiched between the interfacial conductive layers 3c as shown in FIG. 7.

Further, the gate insulating layer 4 is formed on the polysilicon layer 2 and wiring layer 3. Then, on the gate insulating layer 4, the gate electrode layer 11 including the gate electrode 5 and capacitor electrode 6 are formed. On the gate insulating layer 4, the gate electrode 5 is formed in accordance with the channel region 2b of the polysilicon layer 2, and the capacitor electrode 6 is formed in accordance with, the connection pad 10 of the wiring layer 3. Thus, in this embodiment, the connection pad 10 as a part of the wiring layer 3 can be used as a lower electrode of the capacitor. Hence, two steps of a doping step for reducing a resistance of a polysilicon layer for the lower electrode of the storage capacitor and the step of forming the contact hole for the source/drain line can be skipped. Incidentally, as the capacitor insulating film, materials other than the material for the gate insulating layer 4 are used to change the capacitor capacitance.

As described in the first embodiment, to self-align the gate electrode 5 and the channel region 2b, after the formation of the gate electrode 5, the drain region 2c is formed through selective ion implantation with the gate electrode 5 used as a mask, the source region 2a. At this time, the wiring layer 3 formed on the source region 2a and drain region 2c of the polysilicon layer 2 hinders the ion implantation. Hence, it is necessary to take a measure such as recuing a film thickness of the gate insulating layer 4 or a film thickness of the wiring layer 3 upon the ion implantation.

Further, as the conductive layer 3b and interfacial conductive layer 3c of the wiring layer 3, a material having a relatively small ion stopping power is preferred. According to the SRIM (the Stopping and Range of Ions in Matter; James F. Ziegler), materials are ranked in terms of the ion stopping power at an ion energy of 100 to 200 KeV as follows:

Ranking of ion stopping power of phosphorous ions: Si<AL<Ti<Zr<Sn<Cu

Ranking of ion stopping power of boron ions: Si<Al<Ti<Zr<Sn<Cu

As understood from the ranking of ion stopping power, Al can be used as the conductive layer 3b of the wiring layer 3, and as the interfacial conductive layer 3c, Ti, Zr and conductive Ti or Zr compounds can be used. Alternatively, as the wiring layer 3, a single layer made of Ti, Zr and conductive Ti or Zr compounds may be used. Here, from the viewpoint of wiring resistance, a combination of the Al-made conductive layer 3b and the interfacial conductive layer 3c is preferred.

Further, the injection depth of phosphorous ions for forming an n-type region is about ⅓ of the injection depth of boron ions for forming a p-type region at the same injection energy. Hence, ion implantation for the n-type region is more difficult than that for the p-type region. Hence, in the case of injecting phosphorous ions, if the film thickness of the gate insulating layer 4 is set to 30 nm, the film thickness of Al of the conductive layer 3b of the wiring layer 3 is set to 65 nm, and the film thickness of Ti of the interfacial conductive layer 3c is set to 20 nm in a target region, according to the above SRIM, an injection energy of 100 KeV or more is necessary for injecting phosphorous ions to the polysilicon layer 2. If the film thickness of Al of the conductive layer 3b of the wiring layer 3 is set to 160 nm, and the film thickness of Ti of the interfacial conductive layer 3c is set to 200 nm, an injection energy of 200 KeV is necessary for injecting phosphorous ions to the polysilicon layer 2.

On the other hand, in the case of injecting boron ion, if the film thickness of the gate insulating layer 4 is set to 30 nm, the film thickness of Al of the conductive layer 3b of the wiring layer 3 is set to 210 nm, and the film thickness of Ti of the interfacial conductive layer 3c is set to 20 nm, according to the above SRIM, an injection energy of 100 KeV or more is necessary for injecting boron ions to the polysilicon layer 2, the p-type region can be formed more easily that the n-type region.

Then, as shown in FIG. 7, on the gate electrode layer 11, the interlayer insulating film 7 is formed. Further, the contact hole 9 is formed in the predetermined position of the interlayer insulating film 7 and gate insulating layer 4. On the interlayer insulating film 7, the pixel electrode layer 8 is formed. The pixel electrode layer 8 is electrically connected to the gate electrode layer 11 and wiring layer 3 through the contact hole 9 passed through the interlayer insulating film 7 and the gate insulating layer 4. Further, the pixel electrode layer 8 extends from the interlayer insulating film 7 to the connection pad 10 and the insulating substrate 1.

As described above, the film thickness of the wiring layer 3, the gate insulating layer 4, or the like is adjusted to thereby appropriately doped ions to the polysilicon layer without forming the underlying silicon layer 3a at the interface with the polysilicon layer 2 of the wiring layer 3.

Fourth Embodiment

Figure 8:
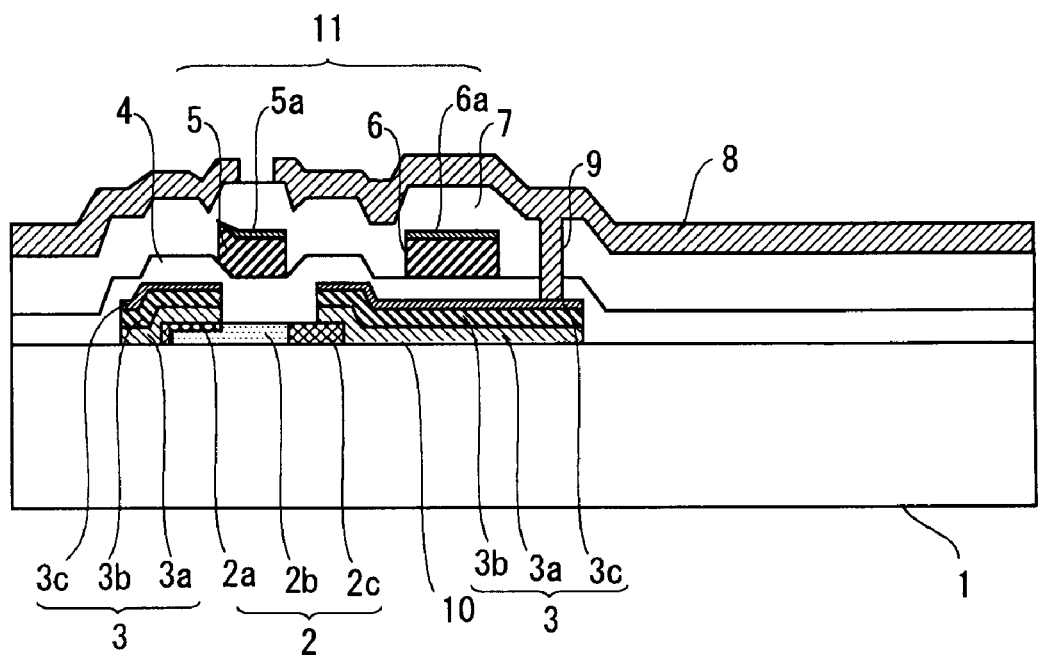
FIG. 8 is a sectional view of the structure of a TFT array substrate according to a fourth embodiment of the present invention.

Referring to FIG. 8, a display device according to a fourth embodiment of the present invention is described. FIG. 8 is a sectional view of the structure of the TFT array substrate 103 used in the liquid crystal display device 100 of this embodiment. This embodiment differs from the first embodiment in that the wiring layer 3 on the source region 2a comes into contact with the channel region 2b. That is, the wiring layer 3 is formed up to above the channel region 2b. In FIG. 8, the same components as those of FIG. 4 are denoted by identical reference numerals, and description thereof is omitted. Further, in this embodiment, as for components other than the TFT array substrate 103, the components of FIGS. 1 and 2 can be used. Thus, in this example, the structure of the TFT array substrate 103 as shows in FIG. 8 is described below.

As shown in FIG. 8, the TFT array substrate 103 of this embodiment includes the insulating substrate 1, the polysilicon layer 2, the wiring layer 3, the gate insulating layer 4, the gate electrode 5, the capacitor electrode 6, the interlayer insulating film 7, the pixel electrode layer 8, the connection pad 10, the gate electrode layer 11, and the like. The polysilicon layer 2 including the source region 2a, the channel region 2b, and the drain region 2c is formed on the insulating substrate 1.

The wiring layer 3 is formed on a part of the polysilicon layer 2. The source line 109 as a part of the wiring layer 3 extends from the source region 2a of the polysilicon layer 2 to the insulating substrate 1. In this embodiment, the source line 109 comes into contact with the channel region 2b. That is, the source line 109 extends up to below the gate electrode 5 as described later. In other words, the source line 109 extends up to above the channel region 2b. Incidentally, at the interface with the polysilicon layer 2 of the wiring layer 3, the underlying silicon layer 3a is formed. Hence, the conductive layer 3b of the wiring layer 3 is not short-circuited with the channel region 2b. Further, the connection pad 10 as a part of the wiring layer 3 extends from the drain region 2c of the polysilicon layer 2 to the insulating substrate 1.

Further, the gate insulating layer 4 is formed on the polysilicon layer 2 and wiring layer 3. Then, on the gate insulating layer 4, the gate electrode layer 11 including the gate electrode 5 and capacitor electrode 6 are formed. On the gate insulating layer 4, the gate electrode 5 is formed in accordance with the channel region 2b of the polysilicon layer 2, and the capacitor electrode 6 is formed in accordance with, the connection pad 10 of the wiring layer 3. Thus, in this embodiment, the connection pad 10 as a part of the wiring layer can be used as a lower electrode of the capacitor. Hence, two steps of a doping step for reducing a resistance of a polysilicon layer for the lower electrode of the storage capacitor and the step of forming the contact hole for the source/drain line can be skipped. Incidentally, as the capacitor insulating film, materials other than the material for the gate insulating layer 4 are used to change a capacitor capacitance.

Further, in this embodiment, the gate electrode 5 is also formed in a position corresponding to an upper portion of the source line 109.

Owing to such structure, a source resistance as an important element of the parasitic resistance of the TFT 118 can be reduced. In particular, in a LDD (Lightly Doped Drain) structure or a GOLD (Gate Overlapped LDD) structure where a conductive impurity concentration in interface regions between the source region 2a and the channel region 2b/the drain region 2c and the channel region 2b is reduced, if the source region has the same structure in view of the manufacturing process, the resistance on the source side can be prevented from increasing and the parasitic resistance of the TFT can be reduced.

Fifth Embodiment

Figure 9:
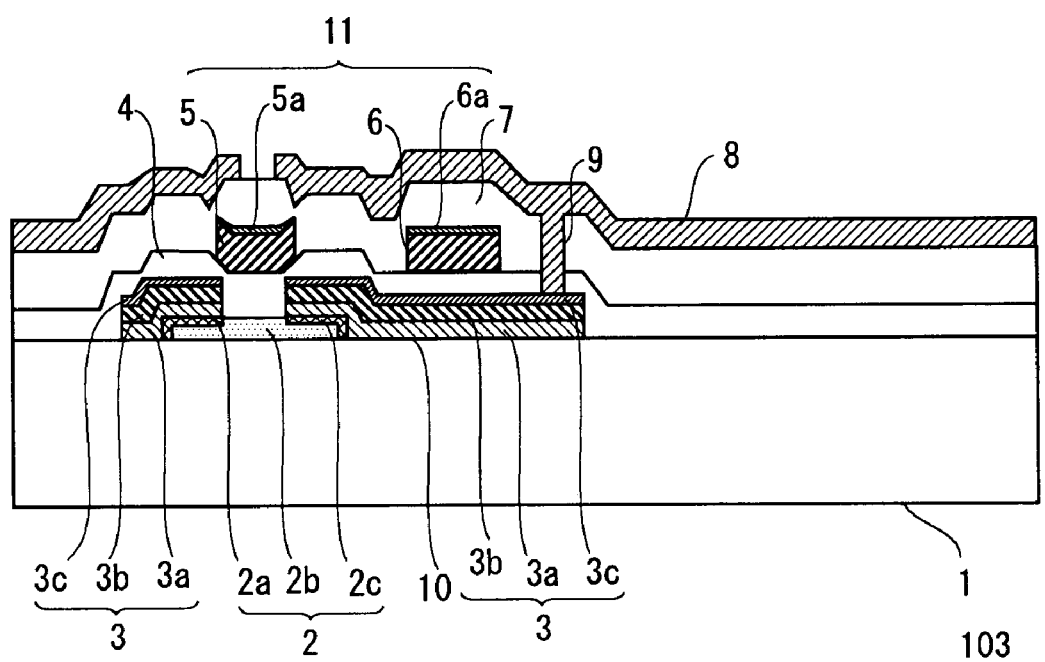
FIG. 9 is a sectional view of the structure of a TFT array substrate according to a fifth embodiment of the present invention.

Referring to FIG. 9, a display device according to a fifth embodiment of the present invention is described. FIG. 9 is a sectional view of the structure of the TFT array substrate 103 used in the liquid crystal display device 100 of this embodiment. This embodiment differs from the first embodiment in that the wiring layer 3 on the source region 2a and the wiring layer 3 on the drain region 2c come into contact with the channel region 2b. That is, the wiring layer 3 extends up to above the channel region 2b. In FIG. 9, the same components as those of FIG. 4 are denoted by identical reference numerals, and description thereof is omitted. Further, in this embodiment, as for components other than the TFT array substrate 103, the components of FIGS. 1 and 2 can be used. In this example, the structure of the TFT array substrate 103 as shown in FIG. 9 is described below.

As shown in FIG. 9, the TFT array substrate 103 of this embodiment includes the insulating substrate 1, the polysilicon layer 2, the wiring layer 3, the gate insulating layer 4, the gate electrode 5, the capacitor electrode 6, the interlayer insulating film 7, the pixel electrode layer 8, the connection pad 10, the gate electrode layer 11, and the like. The polysilicon layer 2 including the source region 2a, the channel region 2b, and the drain region 2c is formed on the insulating substrate 1.

The wiring layer 3 is formed on a part of the polysilicon layer 2. The source line 109 as a part of the wiring layer 3 extends from the source region 2a of the polysilicon layer 2 to the insulating substrate 1. In this embodiment, the source line 109 comes into contact with the channel region 2b. That is, the source line 109 extends up to below the gate electrode 5 as described later. In other words, the source line 109 extends up to above the channel region 2b. Further, the connection pad 10 as a part of the wiring layer 3 extends from the drain region 2c of the polysilicon layer 2 to the insulating substrate 1. The connection pad 10 comes into contact with the channel region 2b. That is, the connection pad 10 extends up to below the gate electrode 5 as described below. In other words, the connection pad 10 extends up to above the channel region 2b. Incidentally, at the interface with the polysilicon layer 2 of the wiring layer 3, the underlying silicon layer 3a is formed. Hence, the conductive layer 3b of the wiring layer 3 is not short-circuited with the channel region 2b.

Further, the gate insulating layer 4 is formed on the polysilicon layer 2 and wiring layer 3. Then, on the gate insulating layer 4, the gate electrode layer 11 including the gate electrode 5 and capacitor electrode 6 are formed. On the gate insulating layer 4, the gate electrode 5 is formed in accordance with the channel region 2b of the polysilicon layer 2, and the capacitor electrode 6 is formed in accordance with, the connection pad 10 of the wiring layer 3. Thus, in this embodiment, the connection pad 10 as a part of the wiring layer 3 can be used as a lower electrode of the capacitor. Hence, two steps of a doping step for reducing a resistance of a polysilicon layer for the lower electrode of the storage capacitor and the step of forming the contact hole for the source/drain line can be skipped. Incidentally, as the capacitor insulating film, materials other than the material for the gate insulating layer 4 are used to change the capacitor capacitance. Further, in this embodiment, the gate electrode 5 is also formed in a position corresponding to an upper portion of the source line 109.

Owing to such structure, a source/drain resistance as an important element of a parasitic resistance of the TFT 118 can be reduced. Further, since the source region 2a and drain region 2c is covered with the wiring layer 3, an ion implantation step for injecting conductive impurities necessary for forming the source region 2a and drain region 2c can be skipped. Further, an impurity concentration of the underlying silicon layer 3a is controlled to reduce a field intensity at an interface between the drain region 2c and the channel region 2b to realize the same effects as those of the LDD.

Sixth Embodiment

Figure 10:
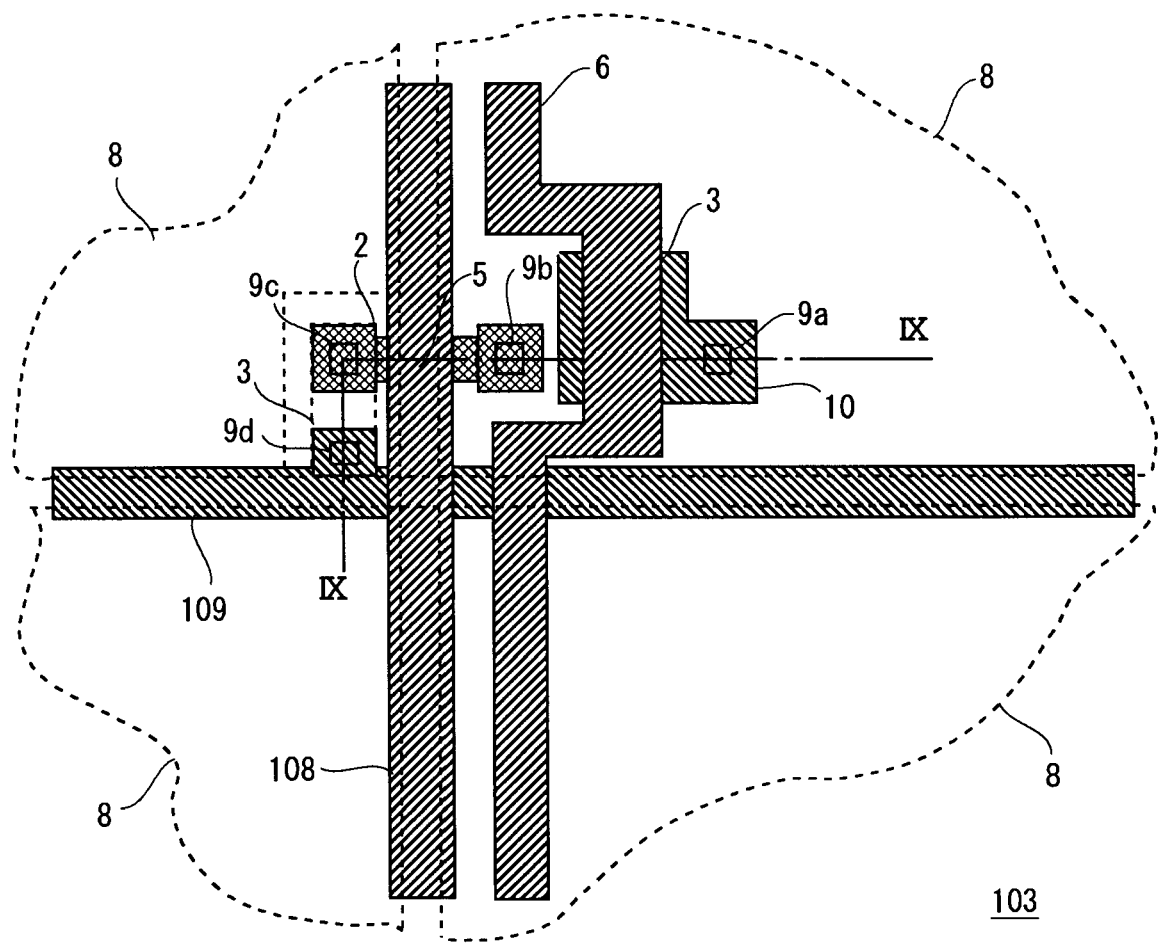
FIG. 10 is a plan view of the structure of a TFT array substrate according to a sixth embodiment of the present invention.
Figure 11:
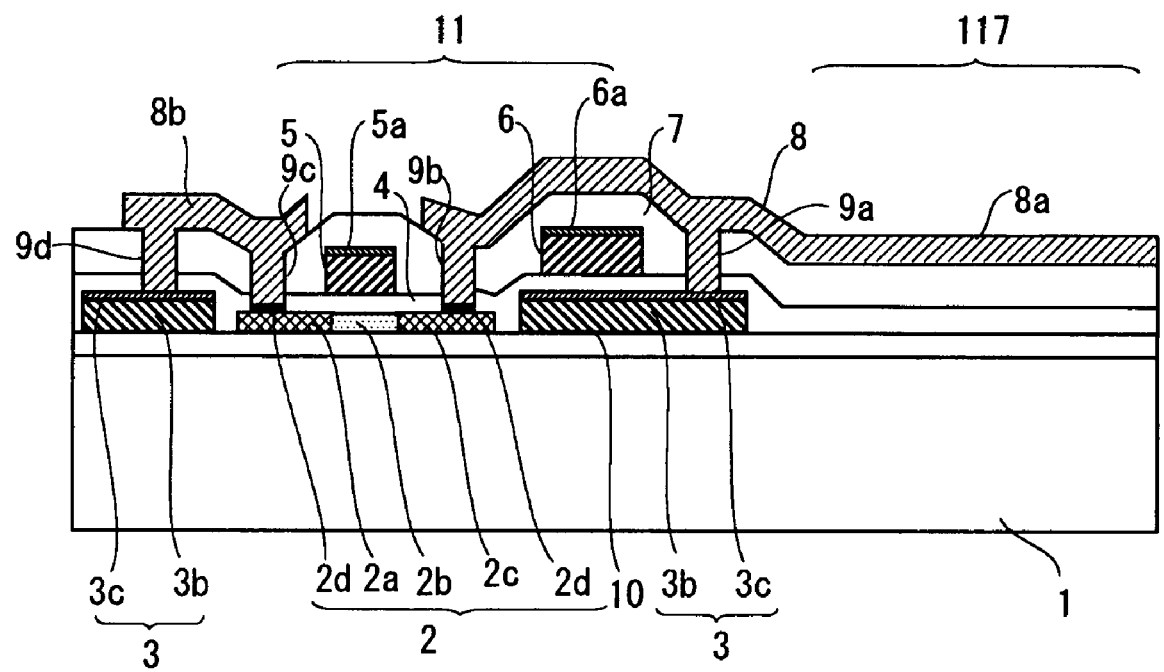
FIG. 11 is a sectional view taken along the line IX-IX of FIG. 10.

Referring to FIGS. 10 and 11, a display device according to a sixth embodiment of the present invention is described. FIG. 10 is a plan view of the structure of the liquid crystal display device 100 of this embodiment. FIG. 11 is a sectional view taken along the line IX-IX of FIG. 10. In this embodiment, unlike the first to fifth embodiments, the wiring layer 3 is not directly connected onto the polysilicon layer 2. Incidentally, in FIGS. 10 and 11, the same components as those of FIGS. 3 and 4 are denoted by identical reference numerals, and description thereof is omitted. Further, in this embodiment, as for components other than the TFT array substrate 103, the components of FIGS. 1 and 2 can be used. Thus, in this example, the structure of the TFT array substrate 103 as shown in FIGS. 10 and 11 is described below.

As shown in FIGS. 10 and 11, the TFT array substrate 103 includes the insulating substrate 1, the polysilicon layer 2, the wiring layer 3, the gate insulating layer 4, the gate electrode 5, the capacitor electrode 6, interlayer insulating film 7, the pixel electrode layer 8, the contact hole 9, and the connection pad 10. Here, the wiring layer 3 includes the source line (signal line) 109 and the connection pad 10. Further, the gate electrode layer 11 includes the gate line (scanning line) 108, the gate electrode 5, and the capacitor electrode 6. Further, the pixel electrode layer 8 may include the pixel electrode and function as a line.

On the insulating substrate 1, the polysilicon layer 2 is formed. The polysilicon layer 2 includes the source region 2a, the channel region 2b, and the drain region 2c. Further, on the insulating substrate 1, the wiring layer 3 is formed independently of the polysilicon layer 2. That is, the wiring layer 3 is formed not to contact the polysilicon layer 2. In other words, the wiring layer 3 is formed away from the polysilicon layer 2. The wiring layer 3 functions as the source line 109 and in addition, forms a predetermined circuit between the TFT 118, the storage capacitor, and the pixel electrode layer 8. As shown in FIG. 11, in this embodiment, a two-layer structure including the conductive layer 3b and the interfacial conductive layer 3c is employed. On the insulating substrate 1, the conductive layer 3b is formed. Then, on the conductive layer 3b, the interfacial conductive layer 3c that comes into contact with the pixel electrode layer 8 is formed. That is, the wiring layer 3 has a structure where the conductive layer 3b and the interfacial conductive layer 3c are formed in order on the insulating substrate 1. Incidentally, as described above, as the wiring layer 3, a single layer made of a refractory conductive material such as Ti may be used. Alternatively, the conductive layer 3b made of Al may be covered with the interfacial conductive layer 3c made of a refractory conductive material and used. Thus, refractory metal or metal compounds are used at the interface of the wiring layer 3 with the pixel electrode layer 8.

On the polysilicon layer 2 and wiring layer 3, the gate insulating layer 4 is formed. Further, on the gate insulating layer 4, the gate electrode 5 is formed in accordance with the channel region 2b of the polysilicon layer 2. Further, on the gate insulating layer 4, the capacitor electrode 6 is formed in accordance with the connection pad 10 as a part of the wiring layer 3. The gate electrode 5 and capacitor electrode 6 are formed with the same layer. As shown in FIG. 10, the gate electrode 5 can be also used as the gate line 108. Further, the capacitor electrode 6 is also used as a common potential line for supplying a common potential to the above opposing electrode 111. The gate electrode 5, the capacitor electrode 6, and the gate line 108 are formed in the gate electrode layer 11.

Further, the interfacial conductive layer 3c is preferably formed on the gate electrode layer 11 and wiring layer 3 such that the pixel electrode layer 8 can be well connected with the gate electrode layer 11 and wiring layer 3. Thus, in this embodiment, the interfacial conductive layer 3c is formed on the wiring layer 3, the interfacial conductive layer 5a is formed on the gate electrode 5, and the interfacial conductive layer 6a is formed on the capacitor electrode 6. The interfacial conductive layer preferably contains at least one of Ti, Cr, Zr, Ta, W, Mo, TiN, ZrN, TaN, WN, and VN as described above.

Further, the capacitor electrode 6 is formed on the connection pad 10 as a part of the wiring layer 3 through the gate insulating layer 4 to use a part of the connection pad 10 as a lower electrode of the capacitor. That is, a capacitor with the capacitor electrode 6 used as an upper electrode, the gate insulating layer 4 used as a capacitor insulating film, and the connection pad 10 used as a lower electrode can be obtained. As a result, a doping step for forming a lower electrode of the capacitor can be skipped. Incidentally, as the capacitor insulating film, materials other than the material for the gate insulating layer 4 are used or film thickness of the capacitor insulating film is changed to change the capacitor capacitance.

As shown in FIG. 11, on the gate electrode layer 11, the interlayer insulating film 7 is formed. The interlayer insulating film 7 is formed to prevent hydrogen from diffusing from a lower layer of the interlayer insulating film 7. As described above, if a film including at least a silicon nitride film is used as the interlayer insulating film 7, dangling bonds of silicon atoms can be reduced in the polysilicon layer 2 and at the interface between the polysilicon layer 2 and the gate insulating layer 4 due to hydrogen distortion. Further, hydrogen is diffused through heat treatment after the formation of the interlayer insulating film 7 to further reduce dangling bonds of silicon atoms. The contact hole 9 is formed in a predetermined position of the interlayer insulating film 7. Here, the contact hole 9a is formed to connect the connection pad 10 with the pixel electrode 8a of the pixel electrode layer 8, and the contact hole 9b is formed to connect the pixel electrode 8a with the drain region 2c of the polysilicon layer 2. Further, the contact hole 9c is formed to connect the pixel electrode lay electrode 8b with the source region 2a of the polysilicon layer 2, the contact hole 9d is formed to connect the connection electrode 8b with the source line 109 as a part of the wiring layer 3.

On the interlayer insulating film 7, the pixel electrode layer 8 is formed. The pixel electrode layer 8 is composed of the pixel electrode 8a and the connection electrode 8b. The pixel electrode 8a is connected to the connection pad 10 and the drain region 2c through the contact holes 9a and 9b passed through the interlayer insulating film 7 and gate insulating layer 4. Further, the connection electrode 8b is connected to the source region 2a and the source line 109 through the contact holes 9c and 9d passed through the interlayer insulating film 7 and gate insulating layer 4. In this embodiment, since the liquid crystal display device 100 is a transmissive type, a transparent electrode made of ITO, IZO, or ITZO is used as the pixel electrode layer 8. Incidentally, as described above, if a reflective type liquid crystal display device, a bottom-emission type organic EL display device, or a top-emission type organic EL display device is used, an appropriate material is selected for the pixel electrode layer 8.

If the pixel electrode layer 8 is a metal oxide film made of made of ITO, IZO, ITZO, or the like, the source region 2a is hardly electrically connected with the drain region 2c of the polysilicon layer 2 because a silicon oxide film grows at the interface of the polysilicon layer 2. Thus, in this embodiment, prior to the formation of the pixel electrode layer 8, a silicide layer 2d is formed at the interface between the polysilicon layer 2 and the pixel electrode layer 8. That is, the polysilicon layer 2 has the silicide layer 2d at the interface with the pixel electrode layer 8. As a result, electrical connection between the polysilicon layer 2 and the pixel electrode layer 8 can be improved.

To form the silicide layer 2d, it is necessary to use metal which silicifies with polysilicon at relatively low temperature and a metal oxide film of which has conductivity. In view of this, as metal to silicify, Co, Ni, Mo, W, or Cr is preferably used. In particular, Co can be readily silicified with the polysilicon layer 2 under heat treatment at about 400° C. and thus is preferred. If high-temperature treatment at 600° C. or higher is required, it is preferred to form a silicide while thermal strain of the insulating substrate 1 is suppressed with RTA (Rapid Thermal Annealing) such as lamp annealing. The degree to which the metal is silicified can be adjusted in accordance with an electrical-connection resistance.

Referring now to FIGS. 12A to 12F, the method of manufacturing the liquid crystal display device 100 of this embodiment is described below. FIGS. 12A to 12F are a manufacturing process diagram for explaining the manufacturing process of the liquid crystal display device 100 of this embodiment. Incidentally, in this embodiment, description about the same steps as those of the manufacturing method of the first embodiment is omitted.

Figure 12A:
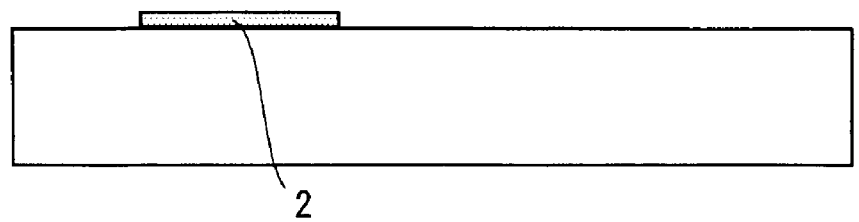
FIG. 12A is a manufacturing process diagram for explaining a method of manufacturing a liquid crystal display device of the sixth embodiment.
Figure 12B:
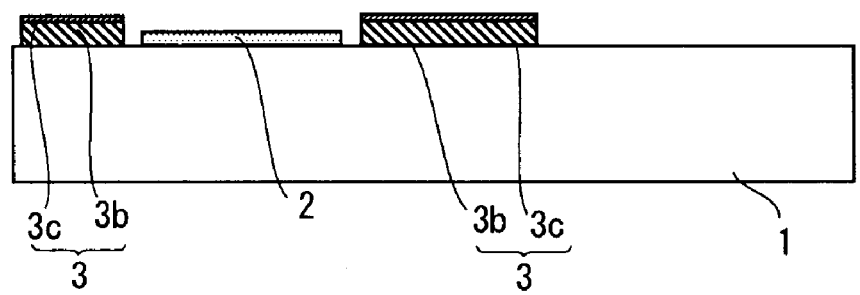
FIG. 12B is a manufacturing process diagram for explaining a method of manufacturing a liquid crystal display device of the sixth embodiment.

As shown in FIG. 12A, the polysilicon layer 2 is first formed on the insulating substrate 1. As described above, the a-Si film is formed, followed by laser annealing to thereby form the polysilicon layer 2. As shown in FIG. 12B, on the insulating substrate 1 having the polysilicon layer 2 formed thereon, the wiring layer 3 is formed not to contact the polysilicon layer 2. To be specific, materials for the conductive layer 3b and interfacial conductive layer 3c are deposited through sputtering on the insulating substrate, and then a predetermined pattern is formed through photoetching. As a result, the wiring layer 3 is formed away from the polysilicon layer 2 on the insulating substrate 1.

Figure 12C:
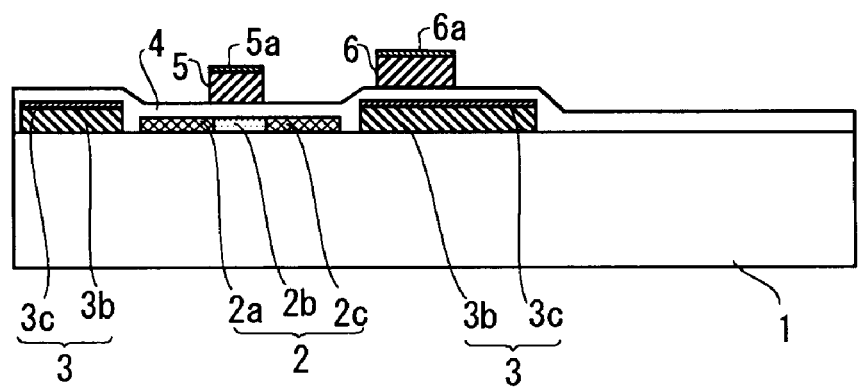
FIG. 12C is a manufacturing process diagram for explaining a method of manufacturing a liquid crystal display device of the sixth embodiment.

After that, as shown in FIG. 12C, the gate insulating layer 4 is formed to cover the polysilicon layer 2 and wiring layer 3. The gate insulating layer 4 is preferably an $SiO_2$ film formed through PECVD with TEOS (Tetra Ethyl Ortho Silicate) as described above. Then, the gate electrode layer 11 including the gate electrode 5, the capacitor electrode 6 and the gate line 108 is formed on the gate insulating layer 4. Further, the interfacial conductive layers 5a and 6a made of TiN having high property of electrical connection with ITO is formed on the gate electrode layer 11. Then, after the deposition of the gate electrode layer 11, the gate electrode 5 and capacitor electrode 6 are patterned into a predetermined shape through photoetching. As a result, the gate electrode 5 and the polysilicon layer 2 are formed face to face through the gate insulating layer 4. Further, the capacitor electrode 6 and the connection pad 10 as a part of the wiring layer 3 are formed face to face through the gate insulating layer 4.

After the formation of the gate electrode 5, ions are selectively doped for forming the source region 2a and drain region 2c with the gate electrode 5 used as a mask to self-align the gate electrode 5 and the channel region 2b of the polysilicon layer 2. As a result, the source region 2a and drain region 2c are formed in the polysilicon layer 2.

Further, on the gate insulating layer 4, the capacitor electrode 6 is formed in accordance with the connection pad 10 as a part of the wiring layer 3 to thereby obtain a capacitor having the capacitor electrode 6 as the upper electrode and the connection pad 10 as the lower electrode. At this time, the gate insulating layer 4 formed between the capacitor electrode 6 and the connection pad 10 is a capacitor insulating layer. Incidentally, as the capacitor insulating layer, materials other than the material for the gate insulating layer 4 may be used, or the film thickness of the capacitor insulating film is made different from the film thickness of the gate insulating layer 4 to thereby change the capacitor capacitance.

Figure 12D:
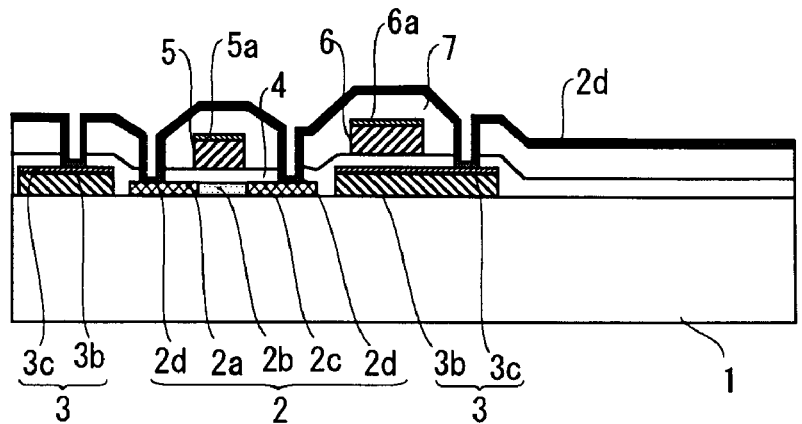
FIG. 12D is a manufacturing process diagram for explaining a method of manufacturing a liquid crystal display device of the sixth embodiment.

As shown in FIG. 12D, the interlayer insulating film 7 is formed to cover the gate insulating layer 4 and the gate electrode layer 11. As the interlayer insulating film 7, as described above, a film capable of preventing hydrogen diffusion, in other words, a film including a silicon nitride film formed through PECVD may be used. Further, as the interlayer insulating film 7, a two-layer structure including a silicon oxide film formed through PECVD with a TEOS as a lower layer and a silicon nitride film formed through PECVD as an upper layer is particularly preferable.

Then, the contact hole 9 is formed in a predetermined position of the interlayer insulating film 7 and gate insulating layer 4. As a result, the connection pad 10 of the wiring layer 3 and the source line 109, and the source region 2a and drain region 2c of the polysilicon layer 2 are partially exposed. The contact hole 9 can be formed through dry etching.

Figure 12E:
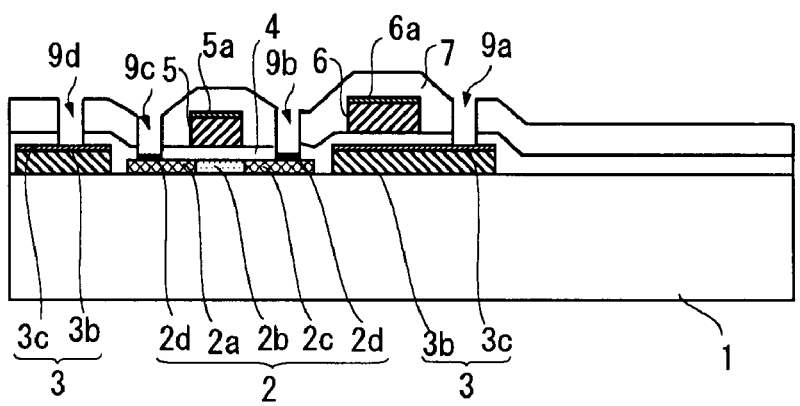
FIG. 12E is a manufacturing process diagram for explaining a method of manufacturing a liquid crystal display device of the sixth embodiment.

After that, the silicide layer 2d is formed at the bottom of the contact holes 9b and 9c. To be specific, a metal film for forming the silicide layer 2d on the interlayer insulating film 7 and inside the contact hole 9 is deposited through sputtering. That is, a metal film for forming the silicide layer 2d is formed above the polysilicon layer 2 at the bottom of the contact holes 9b and 9c. Then, the polysilicon layer 2 and the metal film are annealed at high temperature to thereby form the silicide layer. For example, Co is deposited through sputtering, followed by heat treatment at 400° C. to thereby silicify Co with the polysilicon layer 2. As a result, electrical connection between the pixel electrode layer 8 and the polysilicon layer 2 can be improved. Incidentally, if high temperature of 600° C. or higher is necessary, it is preferred to form a silicide while suppressing thermal strain of a glass substrate with RTA (Rapid Thermal Annealing) such as lamp annealing. Then, heat treatment is performed to form the silicide layer 2d on the surface of the polysilicon layer 2, after which the remaining metal film for forming the silicide layer is removed through wet etching. As a result, as shown in FIG. 12E, the silicide layer 2d can be formed at the bottom of the contact hole 9c formed above the source region 2a of the polysilicon layer 2 and the contact hole 9b formed above the drain region 2c. Incidentally, the residual on the interlayer insulating film 7 is removed by slightly etching off the surface. As a result of silicification, it is possible to prevent the pixel electrode layer 8 from contaminating the polysilicon layer 2.

Figure 12F:
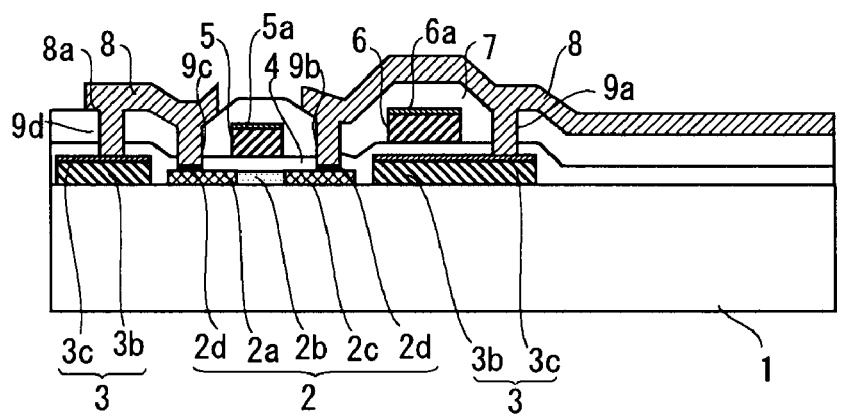
FIG. 12F is a manufacturing process diagram for explaining a method of manufacturing a liquid crystal display device of the sixth embodiment.

After that, as shown in FIG. 12F, the pixel electrode layer 8 including the pixel electrode 8a and connection electrode 8b is formed on the interlayer insulating film 7. As a result, the pixel electrode 8a is electrically connected to the connection pad 10 as a part of the wiring layer 3 through the contact hole 9a passed through the interlayer insulating film 7 and gate insulating layer 4. Further, the pixel electrode 8a is electrically connected to the drain region 2c of the polysilicon layer 2 through the contact hole 9b passed through the interlayer insulating film 7 and gate insulating layer 4. On the other hand, the connection electrode 8b is electrically connected to the source region 2a of the polysilicon layer 2 through the contact hole 9c passed through the interlayer insulating film 7 and gate insulating layer 4. Further, the connection electrode 8b is electrically connected to the source line 109 as a part of the wiring layer 3 through the contact hole 9d passed through the interlayer insulating film 7 and gate insulating layer 4. Incidentally, although not shown, a part of the pixel electrode layer 8 is electrically connected to a terminal formed at the end of the insulating substrate 1. As the pixel electrode layer 8, as described above, a transparent electrode made of ITO or the like can be used. As the pixel electrode layer 8, as described above, a transparent electrode made of ITO or the like may be used. Then, a pixel electrode material deposited on the interlayer insulating film 7 is photoetched into a predetermined shaped to form the pixel electrode and the like.

In this way, the TFT array substrate 103 is formed. After that, the thus-formed TFT array substrate is used to form the liquid crystal panel 101, and the backlight 102, the gate driver IC 113, the source driver IC 114, and the like are mounted to obtain the liquid crystal display device 100 of this embodiment.

As described above, in the method of manufacturing the liquid crystal display device 100 according to the present invention, the wiring layer 3 can be partially used as the lower electrode of the storage capacitor. Hence, a doping step for reducing a resistance of a polysilicon layer for the lower electrode of the storage capacitor can be skipped unlike the related art. Further, since the wiring layer 3 is directly formed on the insulating substrate 1, a contact hole for source/drain lines can be formed through the same step for forming the contact hole for connecting the pixel electrode layer 8 and the connection pad 10. As described above, the number of manufacturing steps can be reduced and productivity can be increased.

Seventh Embodiment

Figure 13:
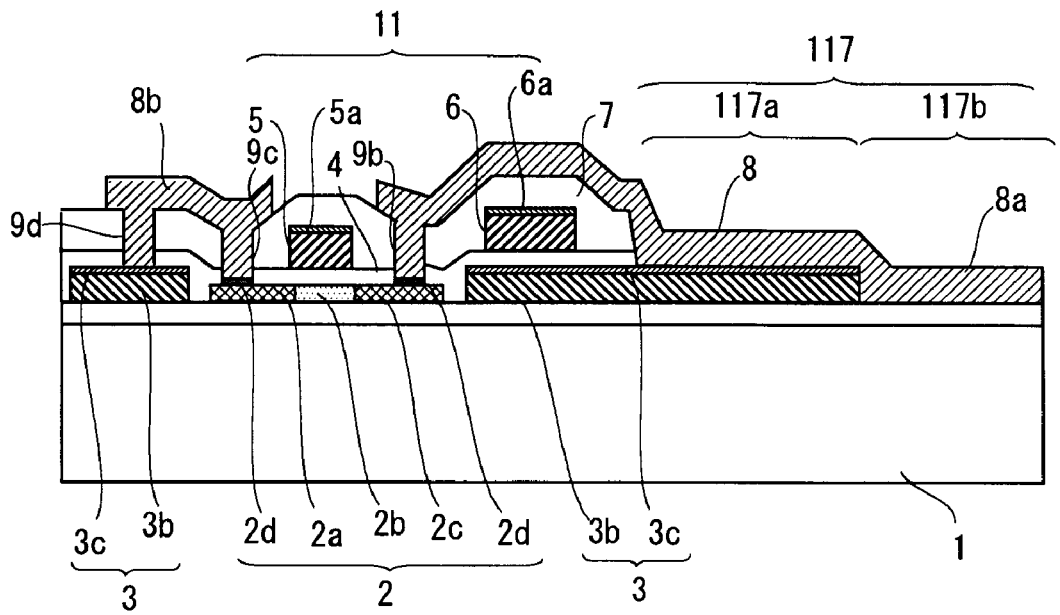
FIG. 13 is a sectional view of the structure of a TFT array substrate according to a seventh embodiment of the present invention.

Referring to FIG. 13, a display device according to a seventh embodiment of the present invention is described. FIG. 13 is a sectional view of the structure of the TFT array substrate 103 used in the liquid crystal display device 100 of this embodiment. This embodiment differs from the sixth embodiment in that the pixel electrode layer 8 partially comes into contact with the insulating substrate 1, and the pixel electrode layer 8 is connected with the wiring layer 3 near a region where the pixel electrode layer 8 comes into contact with the insulating substrate 1. Further, the liquid crystal display device 100 of this embodiment is suitable for a transflective type TFT LCD with the wiring layer 3 used as a reflection electrode and the pixel electrode layer 8 used as a transparent electrode. Hence, in this embodiment, the transflective type liquid crystal display device 100 is described below. In FIG. 13, the same components as those of FIG. 4 are denoted by identical reference numerals and description thereof is omitted. Further, in this embodiment, as for components other than the TFT array substrate 103, the components of FIGS. 1 and 2 can be used. Thus, in this example, the structure of the TFT array substrate 103 of FIG. 13 is described below.

As shown in FIG. 13, the TFT array substrate 103 of this embodiment includes the insulating substrate 1, the polysilicon layer 2, the wiring layer 3, the gate insulating layer 4, the gate electrode 5, the capacitor electrode 6, the interlayer insulating film 7, the pixel electrode layer 8, the connection pad 10, the gate electrode layer 11, and the like. The polysilicon layer 2 including the source region 2a, the channel region 2b, and the drain region 2c is formed on the insulating substrate 1. Further, on the insulating substrate 1, the wiring layer 3 is formed not to contact the polysilicon layer 2. Incidentally, the pixel electrode layer 8 is formed on the insulating substrate 1 as described below. Further, the pixel electrode layer 8 is formed on the interlayer insulating film 7 and the wiring layer 3. That is, the pixel electrode layer 8 extends from the interlayer insulating film 7 to the wiring layer 3 and the insulating substrate 1.

In this embodiment, the wiring layer 3 is made of a material having reflection characteristics. For example, the conductive layer 3b of the wiring layer 3 may be formed of Al, Ag, or the like. Then, the wiring layer 3 has a two-layer structure including the conductive layer 3b and the interfacial conductive layer 3c as described in the sixth embodiment. Hence, a part of the connection pad 10 in the wiring layer 3 can be used as a reflection electrode. A region having the connection pad 10 as the reflection electrode out of the pixels surrounded by the gate line 108 and the source line 109 is the reflection region 117a. Further, a region having the pixel electrode 8a as the transparent electrode out of the pixels 117 where the connection pad 10 is formed is the transmissive region 117b.

The gate insulating layer 4 is formed on the polysilicon layer 2 and wiring layer 3. Further, the gate insulating layer 4 is formed on a part of the connection pad 10. In the region of the connection pad 10 having no gate insulating layer 4, the pixel electrode layer 8 is directly formed. That is, the connection pad 10 and the pixel electrode layer 8 are directly electrically connected. As described above, in this embodiment, a relatively large area can be set aside for connecting the wiring layer 3 for supplying an image signal to the pixel electrode layer 8 and the pixel electrode layer 8. Further, it is unnecessary to form a contact hole for connecting the pixel electrode layer 8 and the connection pad 10. However, in place of the contact hole for connecting the wiring layer 3 and the pixel electrode layer 8, Although not shown in FIG. 13, a contact hole should be formed in the interlayer insulating film 7 as described below to connect the wiring layer 3 and the gate electrode 5. Hence, there is no large difference in the number of manufacturing steps between this embodiment and the sixth embodiment of FIG. 11.

On the gate insulating layer 4, the gate electrode layer 11 including the gate electrode 5 and capacitor electrode 6 are formed. On the gate insulating layer 4, the gate electrode 5 is formed in accordance with the channel region 2b of the polysilicon layer 2, and the capacitor electrode 6 is formed in accordance with, the connection pad 10 of the wiring layer 3. Thus, in this embodiment, the connection pad 10 as a part of the wiring layer can be used as a lower electrode of the capacitor. Hence, two steps of a doping step for reducing a resistance of a polysilicon layer for the lower electrode of the storage capacitor and the step of forming the contact hole for the source/drain line can be skipped.

On the gate electrode layer 11, the interlayer insulating film 7 is formed. Further, in the predetermined position of the interlayer insulating film 7, the contact hole 9 is formed. Here, the contact hole 9a is formed to connect the connection pad 10 with the pixel electrode 8a of the pixel electrode layer 8, and the contact hole 9b is formed to connect the pixel electrode 8a with the drain region 2c of the polysilicon layer 2. Further, the contact hole 9c is formed to connect the pixel electrode 8b with the source region 2a of the polysilicon layer 2, the contact hole 9d is formed to connect the connection electrode 8b with the source line 109 as a part of the wiring layer 3.

Then, the pixel electrode layer 8 is formed on the interlayer insulating film 7. Hence, as described above, the pixel electrode layer 8 extends from the interlayer insulating film 7 to the connection pad 10 and the insulating substrate 1. As the pixel electrode layer 8, a conductive material made of ITO or the like can be used. The pixel electrode layer 8 is composed of the pixel electrode 8a and the connection electrode 8b. The pixel electrode 8a is connected to the connection pad 10 and the drain region 2c through the contact holes 9a and 9b passed through the interlayer insulating film 7 and gate insulating layer 4. Further, the connection electrode 8b is connected to the source region 2a and the source line 109 through the contact holes 9c and 9d passed through the interlayer insulating film 7 and gate insulating layer 4.

Further, as described in the sixth embodiment, the silicide layer 2d is formed at the interface between the polysilicon layer 2 and the pixel electrode layer 8 to improve connection between the polysilicon layer 2 and the pixel electrode layer 8. Incidentally, the pixel electrode layer 8 on the connection pad 10 as the reflection electrode is preferably removed as much as possible. As a result, reflectivity of the connection pad 10 as the reflection electrode can be increased, and brightness in a reflection mode can be improved. Further, the interfacial conductive layer 3c on the connection pad 10 as the reflection electrode is removed to further increase the reflectivity.

Eighth Embodiment

Figure 14:
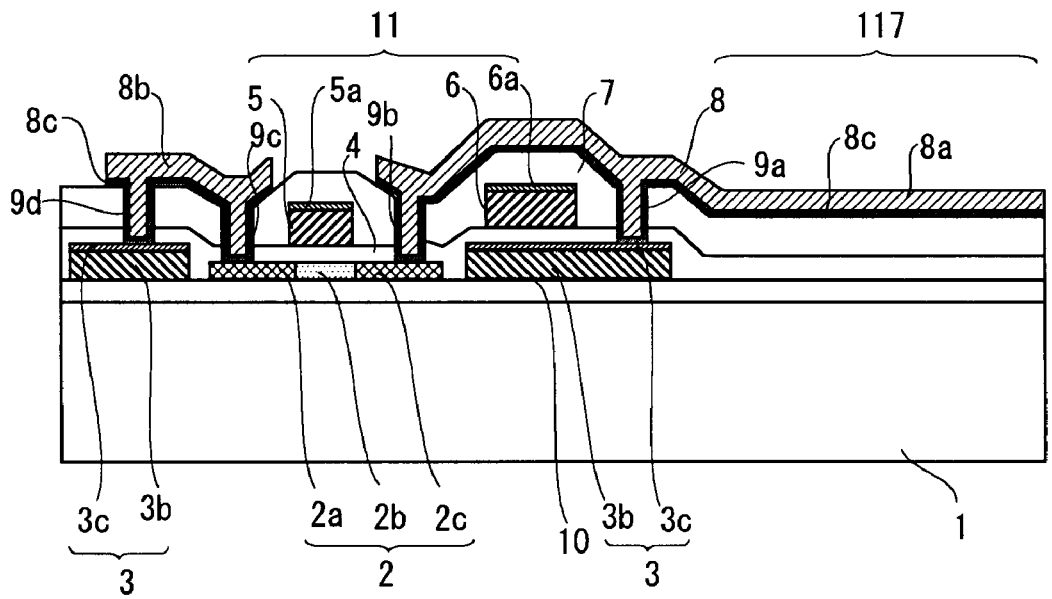
FIG. 14 is a sectional view of the structure of a TFT array substrate according to an eighth embodiment of the present invention.

Referring to FIG. 14, a display device according to an eight embodiment of the present invention is described. FIG. 14 is a sectional view of the structure of the TFT array substrate 103 used in the liquid crystal display device 100 of this embodiment. This embodiment differs from the sixth embodiment in that the interfacial conductive layer 8c is formed below the pixel electrode layer 8. In FIG. 14, the same components as those of FIG. 4 are denoted by identical reference numerals and description thereof is omitted. Further, in this embodiment, as for components other than the TFT array substrate 103, the components of FIGS. 1 and 2 can be used. Thus, in this example, the structure of the TFT array substrate 103 as shown in FIG. 14 is described below.

As shown in FIG. 14, the TFT array substrate 103 includes the insulating substrate 1, the polysilicon layer 2, the wiring layer 3, the gate insulating layer 4, the gate electrode 5, the capacitor electrode 6, interlayer insulating film 7, the pixel electrode layer 8, the contact hole 9, and the connection pad 10. Here, the wiring layer 3 includes the source line (signal line) 109 and the connection pad 10. Further, the gate electrode layer 11 includes the gate line (scanning line) 108, the gate electrode 5, and the capacitor electrode 6. Further, the pixel electrode layer 8 may include the pixel electrode and function as a line.

The polysilicon layer 2 including the source region 2a, the channel region 2b, and the drain region 2c is formed on the insulating substrate 1. Further, on the insulating substrate 1, the wiring layer 3 is formed independently of the polysilicon layer 2. As shown in FIG. 14, in this embodiment, a two-layer structure including the conductive layer 3b and the interfacial conductive layer 3c is employed. On the polysilicon layer 2 and wiring layer 3, the gate insulating layer 4 is formed. Further, on the gate insulating layer 4, the gate electrode 5 is formed in accordance with the channel region 2b of the polysilicon layer 2. Further, on the gate insulating layer 4, the capacitor electrode 6 is formed in accordance with the connection pad 10 as a part of the wiring layer 3. The gate electrode 5 and capacitor electrode 6 are formed with the same gate electrode layer 11. Further, the interfacial conductive layer 5a is formed on the gate electrode 5, and the interfacial conductive layer 6a is formed on the capacitor electrode 6 such that the pixel electrode layer 8 can be well connected with the gate electrode layer 11 and wiring layer 3. Incidentally, in this embodiment, no interfacial conductive layer 3a is formed on the wiring layer 3.

Further, the capacitor electrode 6 is formed on the connection pad 10 as a part of the wiring layer 3 through the gate insulating layer 4, and thus the part of the connection pad 10 can be used as a lower electrode of the capacitor. That is, the capacitor with the capacitor electrode 6 used as an upper electrode, the gate insulating layer 4 used as a capacitor insulating film, and the connection pad 10 used as a lower electrode can be obtained. As a result, a doping step for forming a lower electrode of the capacitor can be skipped. Incidentally, as the capacitor insulating film, materials other than the material for the gate insulating layer 4 are used or film thickness of the capacitor insulating film is changed to change the capacitor capacitance.

As shown in FIG. 14, on the gate electrode layer 11, the interlayer insulating film 7 is formed. As described above, as the interlayer insulating film 7, a film including at least a silicon nitride film is used and thus dangling bonds of silicon atoms can be reduced in the polysilicon layer 2 and at the interface between the polysilicon layer 2 and the gate insulating layer 4 due to hydrogen distortion. Further, the contact hole 9 is formed in a predetermined position of the interlayer insulating film 7.

On the interlayer insulating film 7, the pixel electrode layer 8 is formed. The pixel electrode layer 8 is composed of the pixel electrode 8a and the connection electrode 8b. The pixel electrode 8a is connected to the connection pad 10 and the drain region 2c through the contact holes 9a and 9b passed through the interlayer insulating film 7 and gate insulating layer 4. Further, the connection electrode 8b is connected to the source region 2a and the source line 109 through the contact holes 9c and 9d passed through the interlayer insulating film 7 and gate insulating layer 4.

Further, at an interface of the pixel electrode layer 8 with the interlayer insulating film 7, the interfacial conductive layer 8c is formed. Further, the interfacial conductive layer 8c is formed up to inside the contact hole 9. That is, at the interface of the pixel electrode layer 8 with the polysilicon layer 2 and with the wiring layer 3, the interfacial conductive layer 8c is formed. As a result, electrical connection between the polysilicon layer 2 and the pixel electrode layer 8, and between the wiring layer 3 and gate electrode layer 11 can be easily improved. As a result, an electrical connection property can be easily improved with fewer steps than the manufacturing steps of the above sixth embodiment. Incidentally, in this embodiment, if the pixel electrode layer 8 is made of a transparent conductive material, the transparency may be deteriorated. Hence, it is preferably used for a light emitting display device such as top-emission type organic EL or reflection-type liquid crystal display device.

As described above, the wiring layer 3 including the source line 109 is formed below the gate insulating layer 4 to be the same layer as the polysilicon layer 2 for forming the source region 2a/drain region 2c or overlap with the polysilicon layer 2 to thereby use the wiring layer 3 as a lower electrode of the storage capacitor. Further, the wiring layer 3 can be directly connected to the source region 2a/drain region 2c, so the step of forming a contact hole for source/drain lines can be skipped. Further, the wiring layer 3 can be used as the lower electrode of the storage capacitor, so it is unnecessary to perform the doping step for forming a lower electrode of the storage capacitor and a doping step for reducing a resistance of a polysilicon layer unlike the related art.

As described above, according to the present invention, the 8 patterning steps necessary for the LTPS TFT LCD of the related art can be reduce to 6 steps. Further, is a single channel structure similar to the a-Si TFT LCD structure is used in place of the above complementary-type MOS (CMOS) structure, according to the present invention, the LTPS TFT can be formed through as many patterning steps as those necessary for the a-Si TFT LCD. Thus, the number of patterning steps for the LTPS TFT is reduced, and productivity can be improved.

Further, in the transflective type TFT LCD, the wiring layer is used as the reflection electrode to thereby omit the step for forming a reflection electrode. Thus, the reflection-type LCD can be manufactured through as many patterning steps as those necessary for the transmissive type LCD.

Incidentally, the above embodiments describe the SA (Self Aligned) TFT, but the present invention is not limited thereto. For example, the same effects can be attained with an LDD (Lightly Doped Drain) TFT and GOLD (Gate-Overlapped LDD) TFT. Further, the present invention produces similar effects if applied to an active matrix display device using, for example, a microcrystal silicon TFT made of crystalline silicon formed by various methods as well as existing LTPS TFTs made of polysilicon formed through the above laser annealing. Further, the present invention is applicable to not only the LCD but also the other active matrix display device such as an active matrix organic EL display device.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:
1. A display device, comprising:
a crystalline silicon layer formed on a substrate and including a source region, a drain region, and a channel region;
a wiring layer including a signal line and formed to cover at least a predetermined portion on the source region and the drain region;
a gate insulating layer formed on the crystalline silicon layer and the wiring layer;
a gate electrode layer formed above the gate insulating layer and including a scanning line, a gate electrode corresponding to the channel region, and a capacitor electrode corresponding to a predetermined portion of the wiring layer, the capacitor electrode being formed separately from the scanning line and the gate electrode and being configured to form a capacitor with the wiring layer;
an interlayer insulating film formed on the gate electrode layer and the gate insulating layer; and
a pixel electrode layer formed on the interlayer insulating film, and including a pixel electrode connected to the wiring layer through a contact hole formed in the gate insulating layer and the interlayer insulating film.

2. The display device according to claim 1, wherein, the wiring layer includes at least,
a first layer; and
a second layer formed on the first layer,
the first layer, which comes into contact with the source region and the drain region, is a silicon film containing a conductive impurity, and
the second layer includes a metal film.

3. The display device according to claim 1, wherein a portion of the wiring layer formed on at least one of the source region and the drain region extends below the gate electrode.

4. The display device according to claim 2, wherein a portion of the wiring layer formed on at least one of the source region and the drain region extends below the gate electrode.

5. A display device, comprising:
a crystalline silicon layer formed on a substrate and including a source region, a drain region, and a channel region;
a wiring layer including a signal line and not covering the crystalline silicon layer;
a gate insulating layer formed on the crystalline silicon layer and the wiring layer;
a gate electrode layer formed above the gate insulating layer and including a scanning line, a gate electrode corresponding to the channel region, and a capacitor electrode corresponding to a predetermined portion of the wiring layer;
an interlayer insulating film formed on the gate electrode layer; and
a pixel electrode layer formed on the interlayer insulating film, and including a pixel electrode connected to the drain region or the source region through a contact hole formed in the gate insulating layer and the interlayer insulating film, the pixel electrode layer electrically connecting the wiring layer to the crystalline silicon layer through an other contact hole in the gate insulating layer and the interlayer insulating film.

6. The display device according to claim 5, wherein the crystalline silicon layer includes a silicide layer containing at least one of Co, Ni, Mo, W, and Cr at an interface with the pixel electrode layer.

7. The display device according to claim 1, wherein an interface portion between the wiring layer and the pixel electrode layer contains at least one of Ti, Cr, Zr, Ta, W, Mo, TiN, ZrN, TaN, WN, and VN.

8. The display device according to claim 5, wherein an interface portion between the wiring layer and the pixel electrode layer contains at least one of Ti, Cr, Zr, Ta, W, Mo, TiN, ZrN, TaN, WN, and VN.

9. The display device according to claim 1, wherein the wiring layer is made of a material having reflection characteristics.

10. The display device according to claim 5, wherein the wiring layer is made of a material having reflection characteristics.

* * * * *